(12) United States Patent
Dirksen et al.

(10) Patent No.: US 7,037,626 B2
(45) Date of Patent: May 2, 2006

(54) LITHOGRAPHIC METHOD OF MANUFACTURING A DEVICE

(75) Inventors: Peter Dirksen, Leuven (BE); Casparus Anthonius Henricus Juffermans, Leuven (BE); Johannes Van Wingerden, Leuven (BE)

(73) Assignee: Koninklijke Philips Electronics N.V., Eindoven (NL)

( * ) Notice: Subject to any disclaimer, the term of this patent is extended or adjusted under 35 U.S.C. 154(b) by 252 days.

(21) Appl. No.: 10/478,339

(22) PCT Filed: May 16, 2002

(86) PCT No.: PCT/IB02/01733

§ 371 (c)(1),
(2), (4) Date: Nov. 17, 2003

(87) PCT Pub. No.: WO02/095498

PCT Pub. Date: Nov. 28, 2002

(65) Prior Publication Data

US 2004/0146808 A1 Jul. 29, 2004

(30) Foreign Application Priority Data

May 18, 2001 (EP) ................................ 01201891

(51) Int. Cl.
*G01F 9/00* (2006.01)

(52) U.S. Cl. ........................................................ 430/5
(58) Field of Classification Search .................. 430/5, 430/311–313, 394; 716/19–21
See application file for complete search history.

(56) References Cited

U.S. PATENT DOCUMENTS

| | | | |
|---|---|---|---|
| 6,541,165 B1 * | 4/2003 | Pierrat | 430/5 |
| 6,593,064 B1 * | 7/2003 | Gelbart | 430/311 |
| 6,670,695 B1 * | 12/2003 | Gau et al. | 257/649 |
| 6,807,662 B1 * | 10/2004 | Toublan et al. | 716/21 |

* cited by examiner

*Primary Examiner*—S. Rosasco
(74) *Attorney, Agent, or Firm*—Peter Zawilski

(57) ABSTRACT

For lithographically manufacturing a device with a very high density, a design mask pattern (120) is distributed on a number of sub-patterns (120a, 120b, 120c) by means of a new method. The sub-patterns do not comprise "forbidden" structures (135) and can be transferred by conventional apparatus to a substrate layer to be patterned. For the transfer, a new stack of layers is used, which comprise a pair of a processing layer (22; 26) and an inorganic anti-reflection layer (24; 28) for each sub-pattern. After a first processing layer (26) has been patterned with a first sub-pattern, it is coated with a new resist layer (30) which is exposed with a second sub-pattern, and a second processing layer (22) under the first processing layer is processed with the second sub-pattern.

17 Claims, 14 Drawing Sheets

LITHOGRAPHIC METHOD OF MANUFACTURING A DEVICE

The invention relates to a method of manufacturing a device in at least one layer of a substrate, the method comprising the steps of:

providing a design pattern comprising pattern features corresponding to device features to be configured in said layer;

transferring the design pattern in a resist layer provided on said substrate layer;

removing material from or adding material to areas of said layer, which areas are delineated by the patterned resist layer;

a number of sub-patterns each comprising different portions of the design pattern being successively transferred in a corresponding number of resist layers, which are successively coated on said substrate layer.

The invention also relates to a method of distributing pattern features of a design pattern on a number of sub-patterns.

The invention further relates to an assembly of lithographic sub-masks together forming a fictitious design mask for configuring a device pattern in a layer of a substrate.

For performing said manufacturing method, use is made of an optical lithographic projection apparatus. A lithographic projection apparatus is an essential tool in the manufacture of integrated circuits (ICs) by means of masking, etching and implantation techniques. For each device layer to be configured, a design mask pattern comprising pattern features corresponding to the device feature of said layer is imaged by means of such an apparatus in a radiation-sensitive film coated on said layer before the imaging step is performed. The design mask pattern is the result of a pattern design process for a substrate layer, which process precedes the substrate layer configuring process. The radiation-sensitive layer, which is specifically sensitive to the radiation used for imaging, changes its properties in areas where the radiation is incident. Such a layer is an embodiment of a resist layer, which term also covers a layer which is sensitive to a charged-particle beam, for example an electron beam. In practice, a radiation-sensitive layer may also be sensitive to an electron beam. Transferring a pattern is understood to mean both imaging a corresponding mask pattern in a resist layer and writing a pattern in such a layer, for example by means of an electron beam. During the device manufacturing process, consecutive mask patterns, each one for another substrate layer, are imaged on the same target, for example IC area, on the substrate.

The lithographic method and apparatus may also be used in the manufacture of other devices like, for example, integrated or planar optical devices, magnetic heads or liquid crystalline display panels.

A substrate is understood to mean a plate of material, for example silicon, into which a complete multilevel device, such as an IC, is to be formed level by level by means of a number of successive sets of processing steps. Each of these sets comprises as main processing steps: coating a radiation-sensitive, or resist, layer on the substrate, aligning the substrate with a mask, imaging the pattern of this mask in the resist film, developing the resist film, etching the substrate via the resist film, and further cleaning and other processing steps. The term substrate covers substrates at different stages in the manufacturing process, i.e. both a substrate having none or only one level of already configured device features and a substrate having all but one level of already configured device features, and all intermediate substrates.

Since it is desirable to steadily increase the number of electronic components in an IC device and the operating speed of such a device, the width of the device features, or line width, and the distance between these features should be steadily decreased. As a consequence, mask patterns with increasingly smaller pattern features and smaller distances between these features should be imaged. The minimum size of pattern features, which can be imaged with the required quality by a lithographic projection apparatus, depends on the resolving power, or resolution, of the projection system of this apparatus and the structure of the mask pattern. This resolution is proportional to $\lambda/NA$, wherein $\lambda$ is the wavelength of the projection beam and NA is the numerical aperture of the projection system. An increase of the numerical aperture and/or a decrease of the wavelength could increase the resolution. In practice, an increase of the numerical aperture, which is fairly large in current lithographic projection apparatus, is not very well possible because this reduces the depth of focus of the projection system, which is proportional to $\lambda/NA^2$. Moreover, it becomes too difficult to correct the projection system throughout the required image field when further increasing the numerical aperture. A reduction of the wavelength in the deep UV (DUV) region from 193 nm, as used in lithographic projection apparatus nowadays under development, to, for example 157 nm poses new problems with respect to materials for optical elements of the projection system and resist films which are sensitive to the wavelength of this radiation. It has been proposed for the next generation of lithographic projection apparatus to use extreme UW (EUV) radiation with a wavelength of the order of 13 nm. It is true that the use of such radiation allows a considerably finer pattern structure to be imaged, but the design and development of an EUV projection apparatus is a very challenging and time-consuming task. As EUV radiation is easily absorbed by air, the path of the projection beam should be in vacuum, which poses specific and new problems. A suitable and efficient EUV radiation source is not available and also new resist materials, sensitive to EUV radiation, have to be developed. An EUV projection apparatus suitable for device production will not become available in the coming years.

There is thus a great need for a method of manufacturing a device with device features which are considerably smaller as compared with those of currently manufactured devices, which method uses a conventional projection apparatus.

U.S. Pat. No. 5,716,758 discloses a method of forming a fine periodic linear pattern on a semiconductor substrate, which period is smaller than the resolving power of the projection apparatus. In accordance with this method, a first and a second chrome mask are formed, whose mask patterns are interlaced, i.e. when superposed, the strips of the first pattern are between adjacent strips of the second pattern. An organic material layer, serving as a reflection protective layer, is coated on the substrate top layer wherein the device pattern is to be configured. The organic material layer is patterned by means of the first mask. A photosensitive film is formed on the patterned organic material layer and this film is patterned by means of the second mask, in such a way that each feature of the photosensitive film pattern is interposed between two adjacent features of the organic material layer pattern. The total structure composed of the features of the organic layer pattern and the interposed features of the photosensitive film pattern is used as a mask for etching the substrate top layer. This top layer is the only process layer used for configuring the relevant level of the substrate.

The method described in U.S. Pat. No. 5,716,758, which employs two mask patterns, is used to print periodic linear patterns and to halve the period of the pattern that can be imaged in a satisfactory way. Said total structure of features shows a relatively large topography, i.e. height structure. In the simplest embodiment of FIG. 3 in U.S. Pat. No. 5,716,758, the features of the photosensitive film pattern already have a height which is larger than the distance between these features and those of the organic layer pattern. In the other, more complicated embodiments wherein more layers are used, the height-to-distance ratio is even larger. Due to the topography of the total structure of features, etching of the substrate top, or process, layer through this structure with the required accuracy is very difficult, if not impossible. This renders the method of U.S. Pat. No. 5,716,758 quite impractical.

Another problem, not addressed by U.S. Pat. No. 5,716,758, relates to the physical structure of masks used in optical lithography. This problem becomes more manifest with an increasing feature density in the mask pattern. The method of U.S. Pat. No. 5,716,758 uses chrome masks. Such masks consist of a transparent layer of, for example, quartz, which is covered on one side with a patterned chrome layer. The openings in this layer determine the pattern that is being projected in a resist layer. To decrease the minimum feature width that can be imaged with the required quality, a phase-shift mask, comprising transparent phase-shifting elements, is currently used, which mask may be a chromium phase-shift mask or a chromium-less phase-shift mask. In a chromium phase-shift mask, phase-shifting elements are arranged at transitions of the chromium layer and the mask substrate. By virtue of their interference effects, these elements correct the feature-width broadening caused by diffraction at the chromium/substrate transitions. In a chromium-less phase-shifting, mask the pattern features are determined completely by phase-shifting elements. Providing a mask with phase-shifting elements means that a layer surface area portion on this mask should be reserved for each pattern feature as compared with a mask without phase-shifting elements.

Another recently used technique in the field of optical lithography is the optical proximity correction (OPC). Small correction elements are arranged at the mask pattern positions, for example at the edges of a pattern feature or between two very proximate features, where unwanted diffraction resulting in feature-width broadening in the resist layer would occur. These correction elements are not imaged, i.e. they are not resolved, by the projection system, but do diffract the imaging radiation in such a way that they correct said unwanted diffraction. Some space on the mask pattern surface should be reserved for these correction elements.

Still another technique used to enable smaller pattern features to be imaged by the projection system, is adaptation of the illumination of the mask and the projection system. Such an adaptation means that the projection beam does not fill the whole aperture of the projection system, but only a portion or portions of it. This may be a central, circular, portion or an annular part or one portion of each pupil half (dipole) or two portions of each pupil half. However, these types of illumination cannot be used if a mask pattern comprises a given (forbidden) symmetry, space period (pitch) and/or orientation of the features, because a mask pattern with such forbidden parameters cannot be imaged without aberrations. There is a different forbidden parameter for each type of illumination.

It is an object of the present invention to provide means for substantially increasing the density of a device pattern that can be configured in a substrate while still using a conventional lithographic projection apparatus. These means relate both to the mask pattern and its manufacture and to the set of processing steps for configuring a device pattern having sub-critical density, i.e. a density which is higher than the resolution of the projection system.

According to the invention, the method as defined in the opening paragraph is characterized by the additional steps of:

forming a stack of at least a first pair of a processing layer and an anti-reflection layer and a second pair of such layers on the substrate;

coating a resist layer on the top processing layer and transferring a first sub-pattern in the resist layer;

developing the resist layer, thereby forming a first intermediate pattern corresponding to the first sub-pattern;

etching the top processing layer via the first intermediate pattern, thereby forming a first pattern of device features corresponding to the first sub-pattern;

coating the first pattern of device features with a second resist layer;

transferring a second sub-pattern in the second resist layer;

developing the second resist layer, thereby forming a second intermediate pattern corresponding to the second sub-pattern;

etching an underlying processing layer via the etching mask constituted by the interleaved first pattern of device features and second intermediate pattern, thereby forming a second pattern of device feature corresponding to the combination of the first and second sub-patterns, and removing the second resist layer and the top processing layer.

A processing layer is understood to mean a layer in which device features are configured when carrying out the method. This term covers both a temporary layer, for example the above-mentioned first processing layer, wherein some of the features of the device pattern are temporarily stored and a final layer, which is the top layer of the substrate and in which all features of the device pattern are finally configured.

In the method of the invention, each processing layer is etched via a relatively thin etching mask, constituted by either a patterned resist layer or, preferably a preceding pair of a patterned processing layer and an anti-reflection layer, so that etching is well controlled and accurate. As a separate anti-reflection layer is present for each processing layer which will not be attacked during etching of the preceding processing layer, an intact anti-reflection layer is always available. The successively transferred sub-patterns need not be interlaced, but may comprise overlapping areas and the total mask pattern may have an arbitrary configuration. This configuration may have a very high density, for example the distance between neighbouring device features in the substrate layer may be as small as 50 nm. This allows the design pattern, in addition to the device features, to be provided with correction elements like phase-shifting elements and OPC elements without introducing the above-mentioned problems inherent in these elements. Since device features, which would constitute a forbidden symmetry, a forbidden pitch and/or a forbidden orientation in a design pattern, can be distributed on at least two sub-patterns, the problem of forbidden parameters can be solved.

An embodiment of the method is further characterized in that at least a third pair of a processing layer and an anti-reflection layer is added to the substrate side of the stack of layers and in that the following additional steps are carried out:

- coating the second pattern of device features with a third resist layer;
- transferring a third sub-pattern in the third resist layer,
- developing the third resist layer, thereby forming a third intermediate pattern corresponding to the third sub-pattern;
- etching the third processing layer via the coplanar second pattern of device features and the third intermediate pattern, thereby forming a third pattern of device features corresponding to the combination of the first, the second and the third sub-patterns; and
- removing the third resist layer and the second processing layer.

The division of the initial, design, patterns in three sub-patterns and transferring these sub-patterns in the relevant substrate layer allows a further increase of the density of the design pattern with regard to the device features proper but also with regard to other features like correction elements. By using a still larger number of sub-patterns and a corresponding number of processing layers, the density can be increased even further, provided that the throughput, i.e. the number of substrates that can be processed per time unit is still acceptable.

A first embodiment of the method is characterized in that each sub-pattern is transferred in the corresponding resist layer by optically imaging a sub-mask, comprising the sub-pattern, in the resist layer.

This embodiment is most closely linked with the current lithographic technique. For each sub-pattern, the data representing this pattern are directly converted to a physical pattern, the mask pattern, which is imaged as a whole.

A second embodiment of the method is characterized in that at least one of the sub-patterns is transferred to the corresponding resist layer by writing this sub-pattern in the resist layer by means of a charged-particle beam.

Writing of individual pattern features by means of a charged-particle beam, for example an electron beam, may be attractive if the sub-pattern comprises a low number of small particles.

The first embodiment may be further characterized in that all sub-mask patterns are imaged with radiation of the same wavelength range.

The radiation may be deep UV (DUV) radiation, for example radiation with a wavelength of 248 nm, which is currently used in lithographic projection apparatus, or a wavelength of 193 nm.

As an alternative, the first embodiment is characterized in that at least one of the sub-mask patterns is imaged by means of EUV radiation and the other sub-patterns are imaged by means of DUV radiation.

If a lithographic projection apparatus, which employs extreme UV (EUV) radiation, becomes available, it may still be attractive to use such an apparatus only for imaging the most difficult sub-patterns and to image the other sub-patterns by means of more conventional apparatus employing DUV radiation. In general, the sub-mask patterns need not be imaged by one apparatus, but several apparatus, either of the same type or of different types, may be used.

As a further alternative, the first embodiment is characterized in that at least one of the sub-mask patterns is imaged by means of a charged-particle projection beam.

A similar remark as was made with respect to the EUV projection apparatus can be made with respect to a projection apparatus employing a charged-particle beam.

The method is preferably characterized in that, in all pairs of layers, the corresponding layers comprise the same material and have the same thickness, with the exception of the processing layer at the side of the substrate which has a larger thickness than the other processing layer(s).

The transfer of the different sub-patterns to the relevant substrate layer can then be performed by using the same settings of the apparatuses for processing the stack layers belonging to the sub-patterns. As the processing layer at the side of the substrate is not used as an etching mask and the device features are finally configured in this layer, it may be and is thicker than the other processing layer(s).

The method is preferably further characterized in that the material of each layer of a pair is resistant against the etching process used for etching the other layer of the pair.

For each pair of layers, this makes it possible to pattern first the anti-reflection layer of the pair by means of a first etching process and then etch the processing layer by means of a different etching process, with the patterned anti-reflection layer being used as a hard mask. When etching the processing layer, the patterned anti-reflection layer on top of the processing layer, as well as a blank anti-reflection layer of the underlying pair, if present, is not attacked.

The method may be further characterized in that the processing layers used are polysilicon layers.

This embodiment of the method is very suitable for configuring a substrate layer with transistor gates for which polysilicon layer is a very suitable material. In case a substrate layer has to be configured with conductive wiring, at least the processing layer at the side of the substrate may be of a metal, like aluminium or copper.

The method is preferably further characterized in that the anti-reflection layers used are dual layers comprising an anti-reflection film and an oxide film on top of it.

The oxide film functions as an isolating layer between the anti-reflection layer under the film and a resist layer above the film and also forms an etch-stop layer preventing etching of this anti-reflection layer.

The method is preferably further characterized in that the material of a single anti-reflection layer or the material of the anti-reflection film of a dual layer is an inorganic material.

During the process of configuring a sub-pattern in the processing layer belonging to this sub-pattern, the resist should be removed from anti-reflection layer portions, because the device features formed in this processing layer should remain covered with the anti-reflection layer. By using an inorganic material for the anti-reflection layer, removal of the resist, which is an organic material, becomes considerably easier than in the case where the anti-reflection layer is an organic layer, as in the method described in U.S. Pat. No. 5,716,758.

A preferred embodiment of this method is characterized in that the inorganic material is silicon-oxide-nitride $Si_zO_xN_y$.

A sub-embodiment is characterized in that the inorganic material is silicon-nitride SiN.

This special embodiment of silicon-oxide-nitride, with $x=0$, $z=1$ and $y\approx1$, which is a known anti-reflection material in lithography is very suitable for implementing the present method.

The most practical embodiment of the method is characterized in that positive resist layers are used.

Positive resist is by far the most used resist in lithography and will also be used in the applications of the present method.

However, under certain circumstances a negative resist may be used, for example, when there is one small feature in a large empty field, or when a pattern of features has to be inverted.

The method used is then characterized in that positive and negative resist layers are used.

In order to reduce the width of device features in the substrate layer, the method may be characterized in that features of at least one of the intermediate patterns are reduced in size by resist ashing before etching such a pattern in the underlying processing layer.

By combining the new method with the known technology of resist ashing both the distance between device features and the width of these features can be reduced.

The invention also relates to a solution for the problem of manufacturing a mask pattern for configuring a high-density device pattern in a substrate. Usually, an electron beam write apparatus is used for writing a mask pattern in a resist layer. If such an apparatus is used for writing a mask pattern having a very high density the limited resolution of such an apparatus and the problem of proximity effects inherent in such an apparatus become manifest. The proximity effects are due to the mutual repellence of the electrons in small constricted positions of the electron beam and cause smearing of the written features.

According to the invention, said problem can be solved by a method of distributing pattern features of an initial pattern, which cannot be transferred as such in a satisfactory way, on a number of sub-patterns, which method is characterized by the combination of the following distribution rules:

the number of sub-patterns is as small as possible;

in each sub-pattern, device features and their associated features are arranged in such a way that transfer of each device feature is independent of the other device features, and in each sub-pattern, the device features are distributed as uniformly as possible. Satisfying the latter condition means that optimum transfer conditions can be set for each sub-pattern, and forbidden symmetries, periods and feature orientations will not occur. The term associated features covers all features, which are not transferred to a substrate layer but are used during transfer to optimize a device feature or to improve the transfer of this feature. Examples of associated features are assist features to control the width of a device feature in a substrate layer, optical proximity correction elements and scattering bars.

The features of the initial, design, pattern are distributed on a number of sub-patterns, each of which has a lower density than the initial pattern, and the corresponding sub-masks are easier to manufacture than one mask comprising all of the features This distribution method is made applicable in practice due to the new multiple exposure method as described above, of successively imaging the sub-patterns in one device pattern on the substrate.

If this method is used for distributing an initial pattern comprising an initial group of separated polygonal areas, the first rule can be satisfied by the steps of:

removing, from the initial group, the polygonal areas which violate the second and/or third rule and putting these polygonal areas in new groups which satisfy these rules, and putting the remaining initial group and the new groups in separate sub-patterns.

A preferred embodiment of the distribution method is characterized by the steps of:

determining which polygonal areas violate the second and the third rule;

ranking the polygonal areas of the initial group in accordance with the number of violations occurring for these areas, in which the polygonal areas with the highest number of violations have the lowest ranking order number;

forming a second group of polygonal areas with the lowest ranking order number and those with higher ranking order numbers which, in the second group, still satisfy the first and the second rule, and repeating the last step for remaining higher ranking order numbers in the initial group and forming a third and further groups until all polygonal areas in the remaining initial group satisfy the second and the third rule.

The invention also relates to a group of lithographic sub-masks obtained when carrying out the distribution method and used for carrying out the manufacturing method as described above. This group of lithographic sub-masks jointly forming a fictitious total mask for configuring a single device pattern in a layer of a substrate, in which the fictitious total mask has a mask pattern comprising separated polygonal areas, which mask pattern cannot be imaged as such in a satisfactory way, is characterized in that polygonal areas are arranged in each mask pattern of the sub-masks, such that the sub-mask patterns can be imaged satisfactorily.

A preferred embodiment of the group of lithographic sub-masks is characterized in that it comprises sub-masks provided with assist features flanking a device feature and having a specific width for substantially determining the width of the image of the relevant device feature.

The width of the device features can be controlled by using sub-masks with assist features.

As regards the type of sub-masks, the group of sub-masks may show different embodiments.

A first embodiment of the group of lithographic sub-masks is characterized in that the sub-masks are amplitude masks.

The most commonly used amplitude mask is a chrome mask, i.e. a mask comprising a mask pattern in the form of a patterned chromium layer on a transparent substrate.

A second embodiment of the group of lithographic sub-masks is characterized in that the sub-masks are phase masks.

A phase mask shows a constant transmission throughout the mask pattern area while its mask pattern is constituted by a pattern of phase transitions.

A third embodiment of the group of lithographic sub-masks is characterized in that it comprises amplitude masks and phase masks.

Such a group of sub-masks provides the possibility of forming the device features with the most appropriate type of mask for each sub-pattern.

In order to refine device features, the group of chromium sub-masks may be further characterized in that it comprises sub-masks with phase-shifting elements.

For the same reason, the group of phase masks may be characterized in that it comprises phase masks having amplitude elements at phase transition positions.

An amplitude element is understood to mean a mask surface area that changes the amplitude of radiation incident on it. This area may be an absorbing area. A combination of phase transitions and amplitude elements provides the best feature imaging quality.

The group of lithographic sub-masks may be further characterized in that it comprises sub-masks provided with optical correction elements.

The quality of the imaged mask features can be improved with such well-known optical correction elements in the form of, for example, serifs, hammerheads and scattering bars, which are so small that they are not imaged,.

These and other aspects of the invention are apparent from and will be elucidated by way of non-limitative example with reference to the embodiments described hereinafter.

In the drawings:

FIG. 1 schematically shows an embodiment of a lithographic projection apparatus by means of which the method can be carried out;

Figure 1:
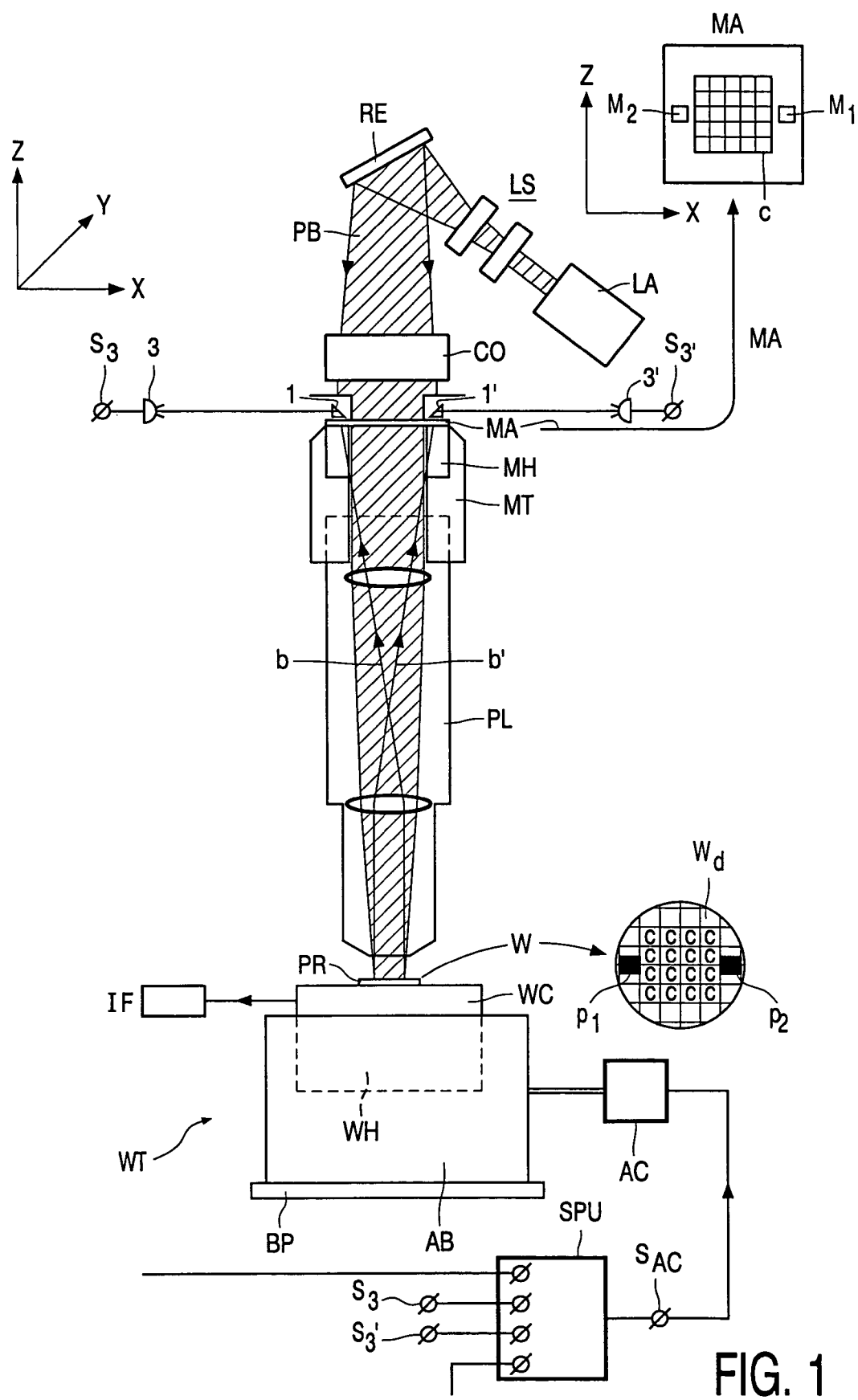

The schematic diagram of FIG. 1 only shows the most important modules of an embodiment of a lithographic projection apparatus. This apparatus comprises a projection column accommodating a projection system, for example, a lens projection system PL. A mask holder MR for carrying a mask MA which comprises a mask pattern C to be imaged is arranged above this system. The mask holder forms part of a mask table MT. A substrate table WT is arranged in the projection column beneath the projection lens system. The substrate table is provided with a substrate holder WH for holding a substrate W, for example a semiconductor substrate, also called a wafer. A radiation-sensitive layer PR, for example a photoresist layer is coated on the substrate. The mask pattern C should be imaged a number of times in the resist layer, every time in another IC area, or die, Wd. The substrate table is movable in the X- and Y-directions, such that, after the mask pattern has been imaged in an IC area, the next IC area can be positioned under the mask pattern and the projection system.

The apparatus further comprises an illumination system provided with a radiation source LA, for example a mercury lamp or an excimer laser like a Krypton-Fluoride excimer laser, a lens system LS, a reflector RE and a collector lens CO. A projection beam PB supplied by the illumination system illuminates the mask pattern C. The projection system PL images this pattern in an IC area on the substrate W.

The apparatus is further provided with a number of measuring systems. One measuring system is an alignment measuring system for determining alignment, in the XY-plane, of the substrate with respect to the mask pattern C. Another measuring system is an interferometer system IF for measuring the X and Y-positions and the orientation of the substrate. A focus-error detection system (not shown) for determining a deviation between the focus, or image field, of the projection system and the radiation-sensitive layer PR on the substrate is also provided. These measuring systems are parts of servosystems, which comprise electronic signal-processing and control circuits and actuators by means of which the position and orientation of the substrate and the focus can be corrected by means of the signals supplied by the measuring systems.

The alignment detection system uses two alignment marks $M_1$ and $M_2$ in the mask MA, which marks are shown in the right top section of FIG. 1. These marks are, for example, diffraction gratings, but may also be constituted by other marks, like squares or strips, which are optically different from their surroundings. The alignment marks are preferably two-dimensional, i.e. they extend in two mutually perpendicular directions, the X and Y-directions in FIG. 1. The substrate W comprises at least two alignment marks, two of which, $P_1$ and $P_2$ are shown in FIG. 1. These marks are positioned outside the area of the substrate W where the images of the mask pattern have to be formed. The grating marks $P_1$ and $P_2$ are preferably phase grating and the grating marks $M_1$ and $M_2$ are amplitude gratings. The alignment detection system may be a double system wherein two alignment beams b and b' are used for detecting alignment of the substrate mark $P_2$ with respect to the mask mark $M_2$ and for detecting alignment of the substrate mark $P_1$ with respect to the mask mark $M_1$, respectively. After having traversed the alignment detection system, each alignment beam is incident on a radiation-sensitive detector 3, 3', respectively. Each detector converts the relevant beam into an electrical signal which is indicative of the degree to which the substrate mark is aligned with respect to the mask mark, and thus the degree to which the substrate is aligned with respect to the mask. A double alignment detection system is described in U.S. Pat. No. 4,778,275, which is referred to for further details about this system.

For accurately determining the X and Y-positions of the substrate, the lithographic apparatus comprises a multiple-axis interferometer system, which is schematically indicated by the block IF in FIG. 1. A two-axis interferometer system is described in U.S. Pat. No. 4,251,160 and a three-axis interferometer system is described in U.S. Pat. No. 4,737,823. EP-A 0,498,499 describes a five-axis interferometer system, by means of which both displacements along the X and Y-axes and rotation about the Z-axis and tilts about the X and Y-axes can be measured very accurately.

As indicated in FIG. 1, the output signal Si of the interferometer system and the signals $S_3$ and $S_3'$ of the alignment detection system are supplied to a signal-processing circuit SPU, for example a microcomputer, which processes these signals to control signals Sac for an actuator AC. This actuator moves the substrate holder WH in the XY-plane, via the substrate table WT.

The projection apparatus is further provided with a focus-error detection system, not shown in FIG. 1, for determining a deviation between the focal plane of the projection lens system and the plane of the radiation-sensitive layer PR. Such a deviation may be corrected, for example, by moving the projection lens system and the substrate relative to each other in the Z-direction, or by moving one or more lens elements of the projection system in the Z-direction. Such a focus-error detection system, which may be fixed to the projection lens system, is described in U.S. Pat. No. 4,356,392. A detection system by means of which both a focus error and a local tilt of the substrate can be detected is described in U.S. Pat. No. 5,191,200.

There is a steadily increasing demand for a decrease of the details, the width of a device feature, or line, and the distance between neighbouring device features, in order to increase the operating speed of the device and/or to increase the number of components in such a device. The smallness of the details which can be imaged satisfactorily by a lithographic projection apparatus, of which FIG. 1 shows an example, is determined by the imaging quality and resolving power of the projection system. The resolving power, or resolution, is conventionally improved by increasing the numerical aperture NA and/or decreasing the wavelength of the projection radiation. A further increase of the numerical aperture can hardly be expected in practice and a further decrease of the wavelength of the projection beam will pose many new problems.

A more recent development on the way to imaging smaller pattern details with projection systems, which can still be manufactured, is the use of a step-and-scanning lithographic apparatus instead of a stepping lithographic apparatus. In a stepping apparatus, a full-field illumination is used, i.e. the entire mask pattern is illuminated in one operation and imaged as a whole on an IC area of the substrate. After a first IC area has been exposed, a step is made to the next IC area, i.e. the substrate holder is moved in such a way that the next IC area is positioned under the mask pattern. Thereafter, this IC area is exposed, and so forth until all IC areas of the substrate are provided with an image of the mask pattern. In a step-and-scanning apparatus, only a rectangular or circular segment-shaped area of the mask pattern is illuminated and hence also a corresponding sub-area of the substrate IC area is each time exposed. The mask pattern and the substrate are moved synchronously through the projection beam, while taking the magnification of the projection system into account. In a continuous process, subsequent sub-areas of the mask pattern are then each time imaged on corresponding sub-areas of the relevant IC area. After imaging the entire mask pattern on an IC substrate in this way, the substrate holder performs a stepping movement, i.e. the beginning of the next IC area is moved in the projection beam. The mask is then set, for example, in its initial position, whereafter said next IC area is scan-exposed. As only the central part of the image field is used in the step-and-scanning method and only this part thus needs to be corrected for optical aberrations, a relatively large numerical aperture can be employed. In this way, the width of the device features and their interspaces, which can be imaged with the required quality, can be decreased to a certain degree. However, this way of increasing the density of device patterns will not be sufficient for coming generations of ICs and other devices. Moreover, due to imperfections of the apparatus, like optical aberrations, and of the lithographic processes, the theoretical limit, set by the numerical aperture, the wavelength and the scanning principle will not be reached in practice.

The problem of considerably increasing the density of a device pattern can be solved by a new method of distributing the features of the initial device pattern on a practical, i.e. limited, number of sub-patterns and by a new method of superposed transfer of the corresponding sub-masks in the substrate. The transfer method will be explained with reference to two neighbouring device features, or strips. Each of these strip-shaped features form part of a separate mask pattern.

Figure 2A:
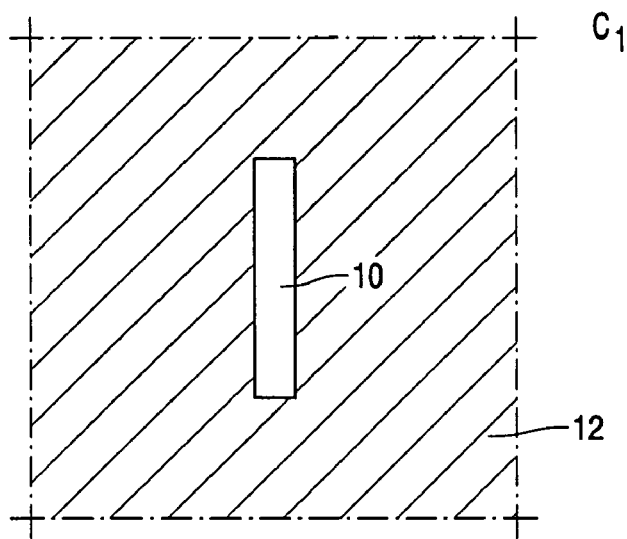
FIGS. 2a and 2b show portions of a first mask pattern with a first feature and a second mask pattern with a second feature, respectively, for use in the new method.
Figure 2B:
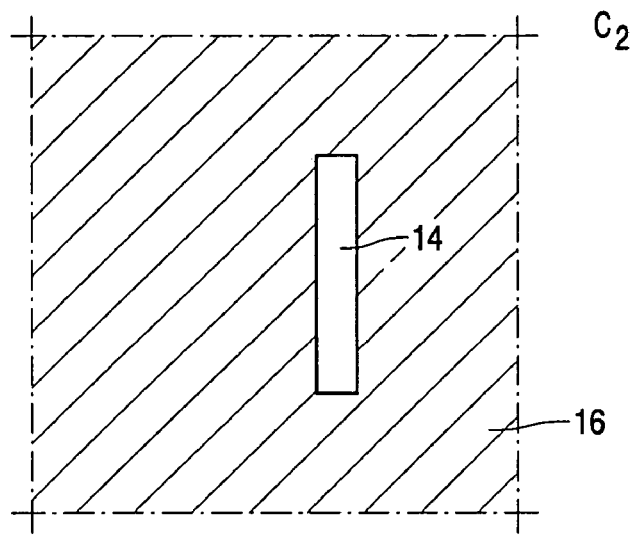

FIG. 2a is a top view of a very small portion of the first mask pattern C1 with only a first feature 10. In the simplest case, the mask is a chrome mask and the feature 10 is a stroke-shaped opening in a chrome layer 12. FIG. 2b shows the first mask pattern C2 with the second feature 14, i.e. a stroke-shaped opening in a chrome layer 16.

Figure 3A:
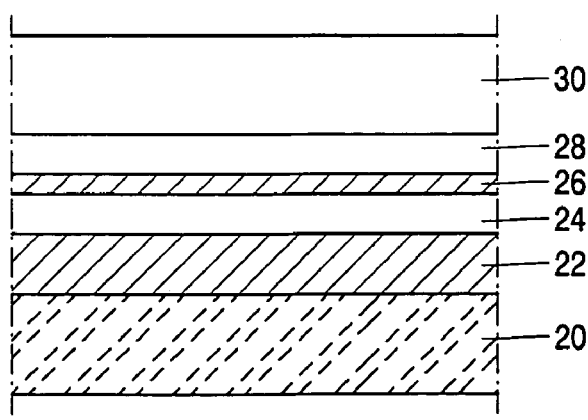
FIGS. 3a to 3h show the consecutive process steps of the method.

FIG. 3a shows a cross-section of the stack of layers, which is used to transfer the mask features to the substrate. In this Figure, reference numerals 20 denotes the top of a substrate, for example a semiconductor substrate. Layer 22 is a first processing layer, for example a polysilicon layer, which is coated with a first anti-reflection layer 24. Layer 26 is a second processing layer, preferably of the same material as the first processing layer. The second processing layer is coated with a second anti-reflection layer 28, preferably of the same material as the first anti-reflection layer.

Figure 3B:
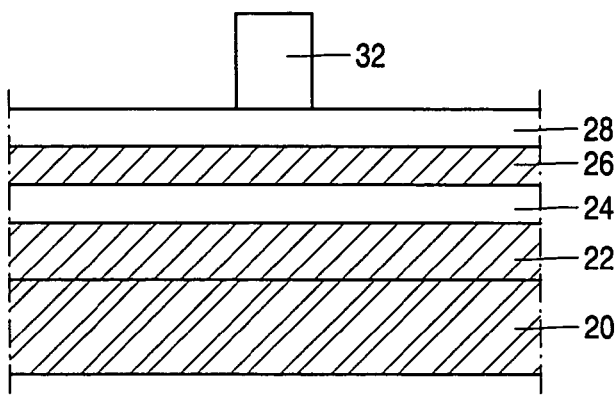
Figure 3C:
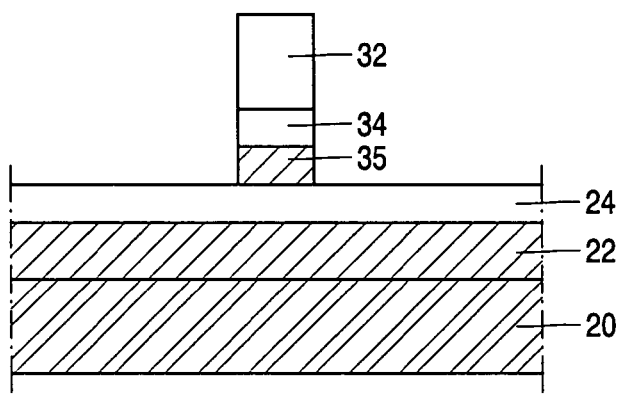
Figure 3D:
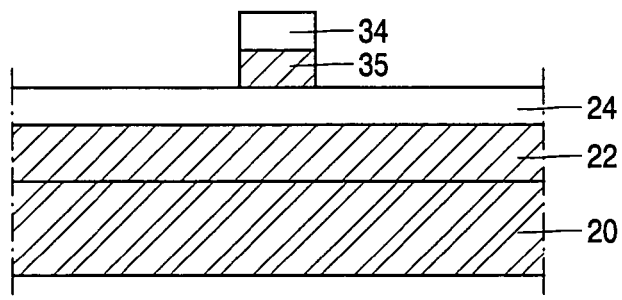

The mask features 10 and 14 are transferred to the first processing layer 22 in the following way. The stack of layers is provided with a resist layer 30 and the first mask pattern is imaged in this layer. The resist layer is illuminated with a stroke of radiation at a position corresponding to the position of the feature 10 in mask pattern C1. After development of the resist and resist stripping, i.e. removal of those parts of the resist layer which have not been illuminated in the case of a positive resist, a stroke 32 of resist material remains on the layer 28, as shown in FIG. 3b. The anti-reflection layer 28 is then etched first and then the second processing layer 26 is etched, using the resist pattern as an etching mask. Feature 10, and other features (not shown) of the first mask pattern have then been transferred to feature 35, i.e. a ridge of processing layer 26 material, as shown in FIG. 3c. On top of this ridge, there is still a stroke 34 of anti-reflective material. In the next step, the stroke 32 of resist material is stripped. As the resist is an organic material and the anti-reflection layer is made of an inorganic material, the resist can easily be removed without attacking the anti-reflection layer. As shown in FIG. 3d, after removal of the resist, the top of the remaining stack of layers is constituted by an anti-reflection layer, both at the position of the feature 35 and other positions of the top surface. Instead of etching the processing layer via the patterned resist layer 32, it is also possible, and even preferred, to etch only the anti-reflection layer via the patterned resist layer and then strip the resist layer. The processing layer is then etched via the patterned anti-reflection layer 34, which forms a so-called hard mask for the processing layer.

Figure 3E:
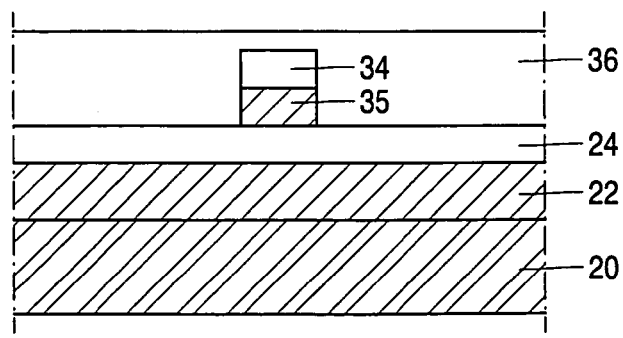
Figure 3F:
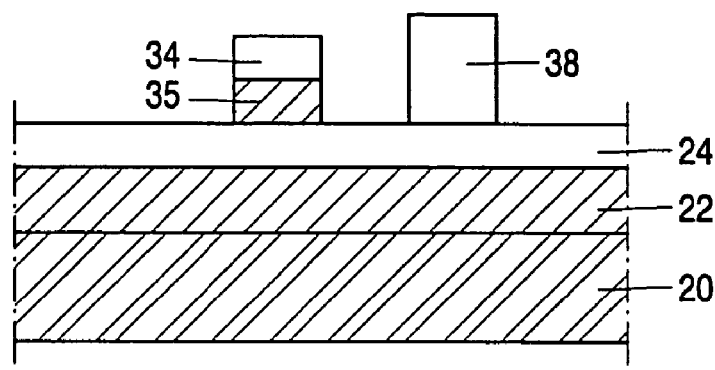
Figure 3G:
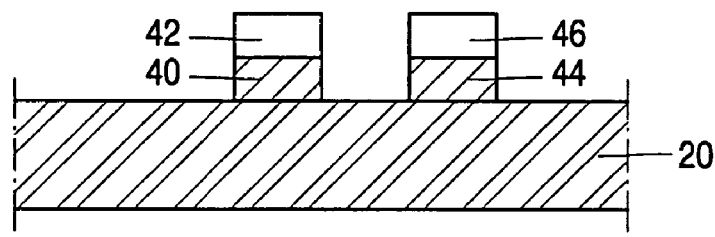
Figure 3H:
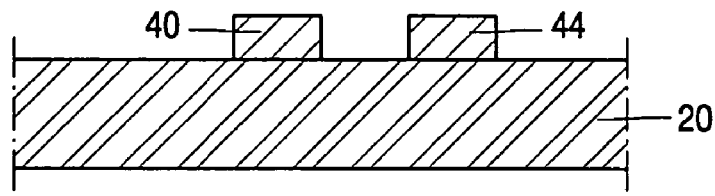

After the first feature 35 has been transferred in this way, the stack of layers is coated with a new resist layer 36, as shown in FIG. 3e. The second mask pattern comprising mask feature 14 is imaged in this resist layer. After development of the resist layer 36 and removal of the exposed parts of this layer, a stroke 38 of resist material remains on the anti-reflection layer 24, as shown in FIG. 3f. The anti-reflection layer 24 and the first processing layer 22 are then etched, using the composed structure of feature 35 (with anti-reflection layer 34 on top) and the resist stroke 38 as an etching mask. The anti-reflection layer 34 and the second processing layer 35 are removed simultaneously with the etching of anti-reflection layer 24 and first processing layer 22. The patterned resist layer 38 is then stripped. The mask features 10 and 14 are now transferred to device features 40 and 44, respectively. These device features are ridges of processing layer 22 material. Both device features are covered by a stroke of anti-reflective material 42 and 46, respectively, shown in FIG. 3g. If no further features have to be transferred, the strokes 42 and 44 of anti-reflective material are removed so that two device features 40, 44 forming the required structure in the top layer of the substrate remain.

As the mask features corresponding to the device features 40 and 44 need no longer be imaged simultaneously, it is no longer the resolution of the projection system that determines the minimum distance d between the features 40 and 44. This minimum distance is now determined by the accuracy with which mask feature 14 can be positioned with respect to device feature 35 previously configured in the second processing layer 26. Lithographic projection apparatuses are available now, which have very advanced alignment servosystems. With such a system, a single machine overlay accuracy better than 10 nm may be obtained, i.e. the error in position of a feature in a resist layer with respect to an underlying previously configured device feature is smaller than 10 nm. By using the new method with such an accurate alignment servosystem, a minimum distance d of the order of 50 nm between the device features can be obtained. The new method makes optimum use of the accuracy of alignment servosystems that are already available.

This method has the advantages that an intact anti-reflection layer is present under the resist layer during each illumination of a resist layer and that the height of the etching mask used for etching the processing layers remains small. For example, the height of an etching mask may be as small as the sum of the thickness of an anti-reflection layer and a processing layer. Due to the small height of the etching masks, optical proximity effects can be neglected.

The use of two mask patterns and an alignment servosystem, as in the embodiment of FIGS. 3a–3h, for realizing two neighbouring device features provides the largest degree of freedom with respect to mask pattern design. If the device pattern is a period pattern with a small period, it is possible to use one mask pattern and to move this pattern, after the first device feature has been configured, over a distance which is equal to the required distance between the two device features.

Each anti-reflection layer 24, 28 may be a double layer of an anti-reflection film and a thin oxide layer on top of it. The oxide layer forms an isolation between the anti-reflection film and a resist layer coated on this double layer when the underlying processing layer is to be patterned. Moreover, the oxide layer forms an etch stopping layer, preventing unwanted etching of the anti-reflection film.

The anti-reflection film is made of an inorganic material, for example silicon-oxyde-nitride $Si_zO_xN_y$. A specific embodiment of this material, namely silicon nitride (z=1, x=0 and y≈1) preferably is used for the anti-reflection film. This material is already used in the lithographic field and is also very suitable for implementing the present method.

Figure 4:
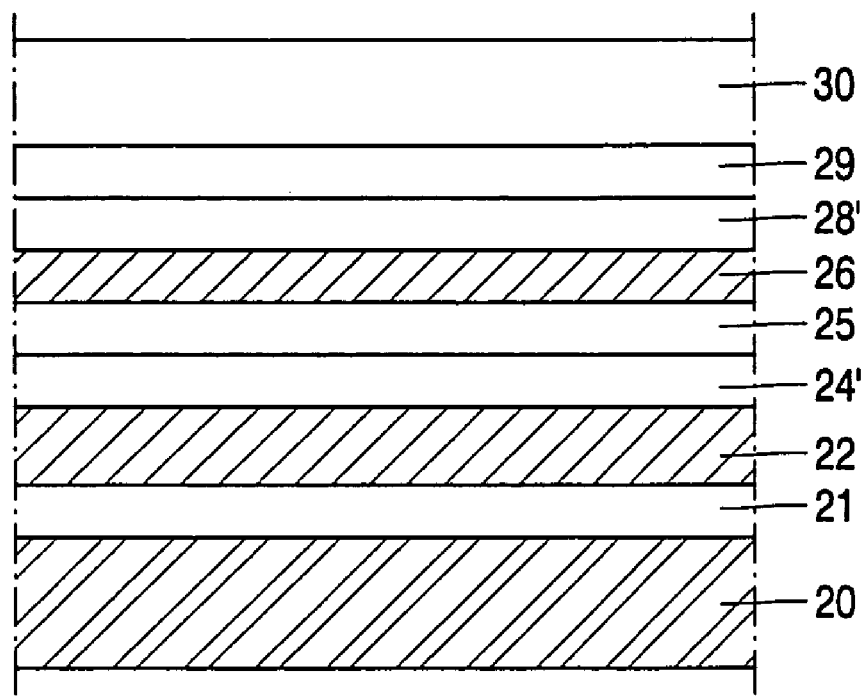
FIG. 4 shows an embodiment of the stack of layers used in the method.

FIG. 4. shows a stack of layers comprising dual anti-reflection layers. Reference numeral 20 denotes the silicon substrate, or wafer. A very thin, so-called gate oxide, layer 21, which isolates the substrate from the processing layer 22, may be arranged, between this substrate and the first processing layer 22, for example of polysilicon. An SiN anti-reflection film 24' and a top oxide layer 25 are arranged on top of the first processing layer. The second processing layer 26 is arranged on top of layer 25. An SiN anti-reflection film 28' and a top oxide layer 29 are arranged on top of the processing layer 26. A resist layer 30 is coated on this double layer.

In a practical embodiment of the stack of layers, the gate oxide layer 21 has a thickness of 2 nm. The polysilicon processing layers 22 and 26 have a thickness of 100 nm and 20 nm, respectively. Each anti-reflection film 24', 28' has a thickness of 23 nm and their top layers 25 and 29 have a thickness of 12 nm each. In this embodiment, the etching mask has a maximum height of 55 nm. After the first mask pattern feature 10 has been imaged in the resist layer 30 and this layer has been developed, the top oxide layer 29 is dry-etched for 20 mseconds. The resist is then stripped, using a standard resist strip and the stack is wet-cleaned. The second polysilicon processing layer 26 is etched via the hard mask formed by the patterned top oxide layer 29 and anti-reflection film 28' in a 5-second cleaning step, a 10-second main etching step and a 10-second over-etching step. During this etching, no resist is present on the stack. After the second mask pattern feature 14 has been imaged in the second resist layer 36 and this layer has been developed, the top oxide layer 25 is etched in the same way as layer 29. The first polysilicon processing layer 22, which is five times thicker than the second processing layer 26, is etched via the patterned oxide layer 25 and anti-reflection film 24' in a 30-second main etching step and a 30-second over-etching step.

The density of a device feature pattern is not only determined by the distance between neighbouring device features, but also by the width of the device features. The contrast of the image formed in a resist layer of two neighbouring mask pattern features decreases and the width of these features formed in a processing layer increases when the distance between the features decreases. Said contrast can be enhanced by using a chrome mask provided with phase-shifting elements, instead of a conventional pure chrome mask, which is a transmission mask. The technique of improving contrast of the images formed in the optical lithography was first proposed by Levenson et al in the article: "Improving resolution in Photolithography with a Phase-Shifting Mask" in IEEE Transactions on Electron Devices, Vol.ED-29, no.12, December 1982, pp 25–32. The conventional transmission mask comprises a transparent, for example, quartz substrate covered by an opaque, preferably chrome layer with apertures. These apertures define the desired intensity pattern and thus the device pattern to be printed in a layer of the substrate. When illuminating such a transmission mask with electromagnetic radiation, the electric field of this radiation has the same phase at every aperture. However, due to diffraction of the radiation at the edges of the apertures and the limited resolution of the projection lens system, the electric field patterns at the substrate level are spread. A single small mask aperture thus provides a wider intensity distribution at substrate level. Constructive interference between waves diffracted by adjacent apertures enhances the electric field between the projections of the apertures at substrate level. As the intensity pattern is proportional to the square of the electric field, this pattern of two adjacent mask apertures is spread evenly to a fairly high degree and does not show two pronounced peaks at the positions of the projected apertures.

Figure 5:
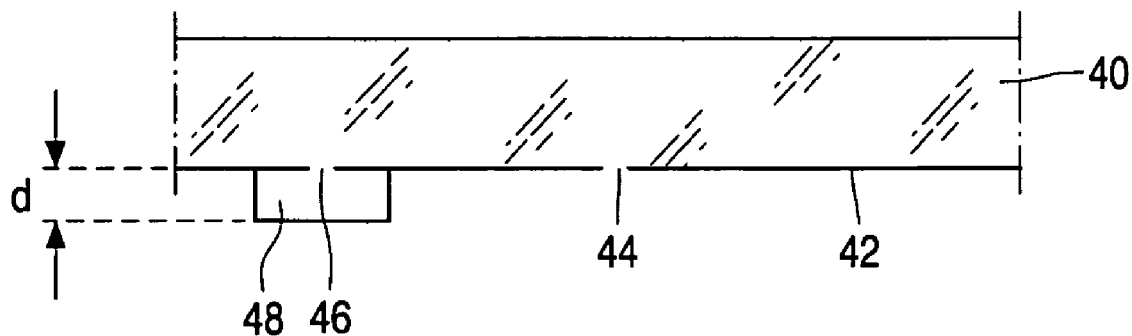
FIG. 5 shows a portion of a phase mask.

FIG. 5 shows a small portion of a chromium mask provided with phase-shifting elements. This mask comprises a transparent substrate 40 covered by a chromium layer 42. Apertures 44 and 46 in this layer constitute two features of the mask pattern. One of the two apertures is covered with a transparent phase-shifting element 48. This element has a thickness d of $\lambda/2(n-1)$, wherein n is the index of refraction of the element material, and $\lambda$ is the wavelength of the projection radiation, such that the waves transmitted through the adjacent apertures 44 and 46 are 180° out of phase with each other. Destructive interference now occurs between the waves diffracted by the adjacent apertures so that the electric field and thus the intensity between the projections of the apertures at wafer level is minimized. Any projection system will project the images of such a phase-shifting mask with a better resolution and higher contrast than a corresponding mask without phase shifters.

Figure 6:
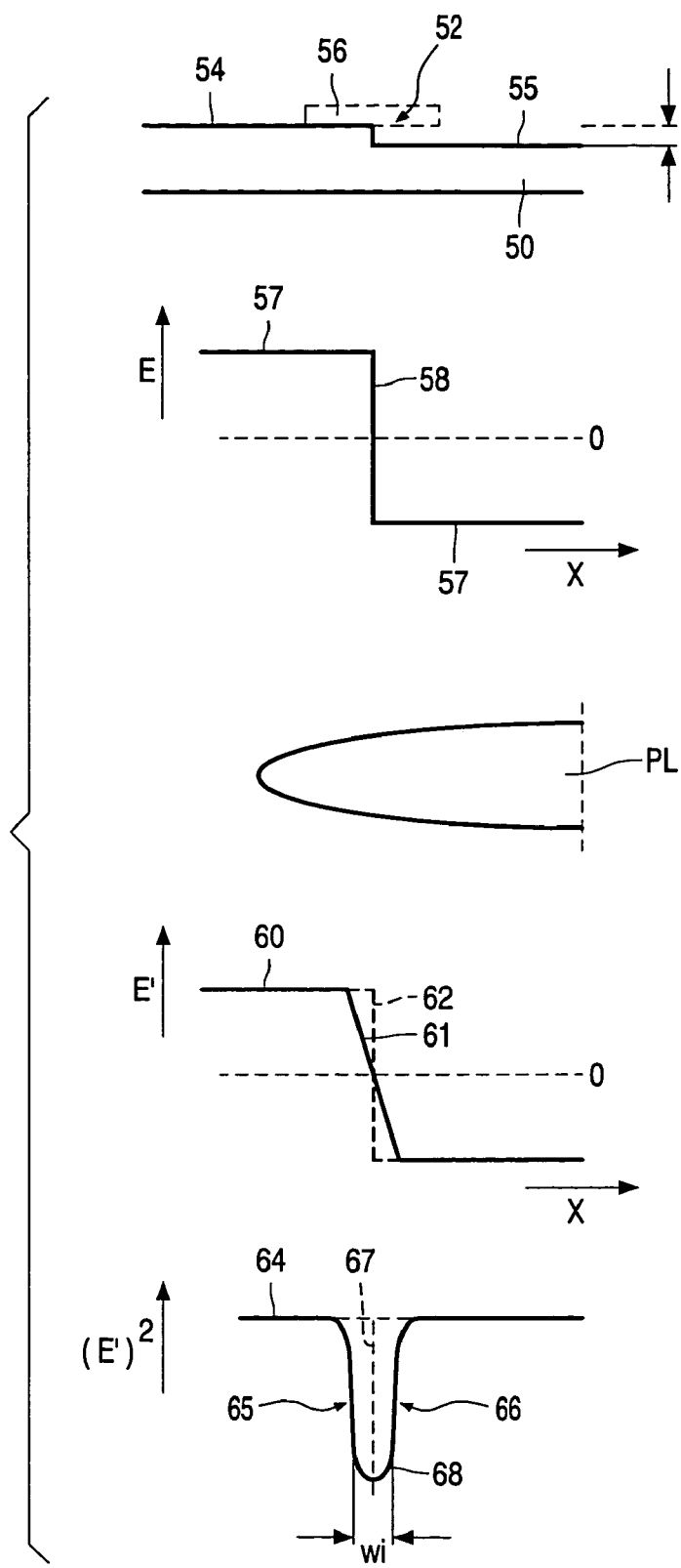
FIG. 6 shows the theory of image forming of a phase mask.

A "chrome-less" phase-shifting mask, as disclosed in EP-A 0.680.624 can provide a similar improvement with respect to contrast and feature width. The pattern structure, defining the device structure, of such a mask does not comprise a pattern structure of chromium, or other opaque material, but the pattern is a pattern of phase transitions. FIG. 6 shows a small portion of a phase mask with one phase transition, or mask feature, 52. The reference numeral 50 denotes the transparent mask substrate. The phase transition is the transition between the surface 54 of the substrate and a recess 55. The depth of this area is denoted by e. As the mask is transparent to the projection PB, the transition is a phase transition to this beam. This means that the portion of the projection beam PB, which has passed the recess area 55, has a different phase than a beam portion which has passed through a surface area 24. The phase difference $\phi$ (in radians) between the beam portions is given by:

$$\phi=(n_2-n_1).e.2\pi/\lambda$$

wherein $n_2$ is the refractive index of the mask substrate, $n_1$ is the refractive index of the surrounding medium, which is usually air with $n_1=1$, and $\lambda$ is the wavelength of the projection beam, which is a beam of electromagnetic radiation.

After having passed through the phase structure, the size of the electric field vector E of the beam as a function of the position x shows the variation of graph 57. The position of the vertical slope 58 in this graph corresponds to the position of the phase transition 52. After passage through the projection system PL, represented schematically by a single half lens element in FIG. 6, the size of the electric field vector E' as a function of the position x shows the variation of graph 60. The vertical slope 58 of graph 57 has been converted to an oblique slope 61 in graph 60. This is a result of the fact that the projection lens system PL is not an ideal system, but has a point-spread function. A point is not imaged as a point, but its radiation is more or less spread across an Airy-pattern. If the projection system were ideal, the electric field vector E' would be vertical, as indicated by the broken line 62. The size of the electric field vector E' represents the amplitude of the projection beam so that graph 60 shows the amplitude of the beam as a function of the position in the plane of the resist layer 30 (36). Since the intensity of the beam is equal to the square of the amplitude ($I=E'^2$), this intensity shows, as a function of the position x, the variation of graph 64. The edge 61 of graph 60 has changed over to two edges with opposite slopes 65 and 66, which means that a line-shaped phase transition of the phase-shifting mask pattern is imaged in a stroke having a certain width wi.

Instead of a transmission pattern, also a reflective phase-shifting mask pattern, i.e. a pattern wherein both the recess area 55 and the surrounding areas 54 are reflective, may be used. In the latter case the optimum depth, or height, of the recess area is equal to a quarter of the wavelength.

A phase-shifting mask may also be provided with amplitude, for example chrome, elements at the positions of the phase transitions. Such an amplitude element 56, shown in FIG. 6 by broken lines, blocks the radiation incident on it. With a combination of a phase transition and amplitude element, the latter determines the position of the device feature and the former determines the width of this feature.

In a concrete application, the width of the strip imaged in the resist layer is dependent on, inter alia, the numerical aperture of the projection system and the coherence value of the illumination. The coherence, or $\sigma-$, value is the ratio of the cross-section of the projection beam in the plane of the pupil of the projection system and the aperture of this system. The a value thus indicates the degree to which the projection system is filled by the projection beam and is usually smaller than one. The width of a device feature, for example a transistor gate, formed in the relevant layer of the substrate after developing the resist and etching is also dependent on the exposure dose used in the lithographic projection apparatus. The exposure dose is the amount of projection, or exposure, radiation, which is incident on a resist layer area during imaging of a mask feature on this area. Once the values of the parameters of numerical aperture, coherence value and exposure dose have been set, all phase transitions of the phase mask pattern are transferred to strips in the substrate layer, of which all have the same width. For example, at an exposure wavelength of 248 nm, a numerical aperture NA=0.63 and a coherence value $\sigma=0.35$, and a feature width of the order of 100 nm can be obtained. However, in practice, device features with different widths, for example, transistor gates with different gate lengths are required in one IC device. Moreover, a further reduction of the feature width is required.

In a technique of adding two assist features to a phase transition, the minimum width of device features can be decreased considerably and this width can be varied over a considerable range, without changing the above-mentioned parameters.

Figure 7:
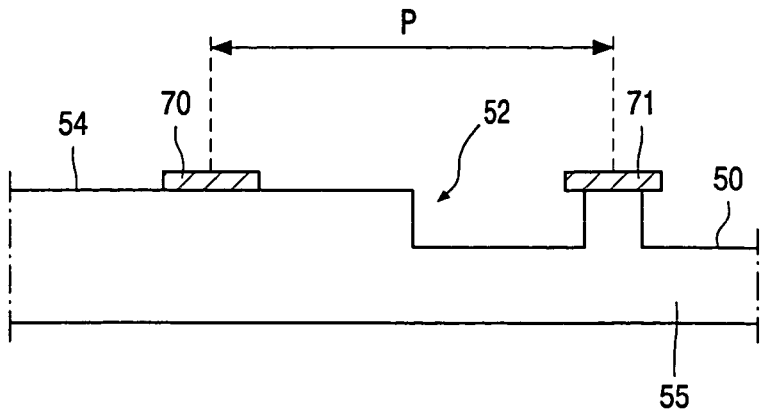
FIG. 7 shows a portion of a phase mask provided with assist features.

FIG. 7 shows the phase transition of FIG. 6 provided with such assist features 70 and 71 at both sides of the transition. These features have such small (sub-resolution) widths that they are not imaged as such in the photoresist, but have a diffracting effect and may therefore be called scattering bars. They may consist of chromium and have a width of, for example, 300 nm. The bars 70 and 71 are arranged symmetrically with respect to the phase transition 52 and their mutual distance is, for example, 2.5 μm. The bar 70 rests on the upper surface 54 of the mask substrate. To provide a support for the bar 71, a small column 73 of mask substrate material should be saved when making the phase transition. The dimensions of this column can be optimized for example, wet etching.

Although the scattering bars 70 and 71 belonging to the phase transition 52 are not transferred to the resist layer, they have an effect on the image of the transition. A portion of the exposure radiation incident on a scattering bar is directed towards the intensity peak 58 of FIG. 6 and interferes with the radiation of the original intensity peak and thus modifies this peak. The technique of adding assist features is based on the recognition that the width of the image of a feature formed in the resist layer, and thus the width of the device feature printed in the substrate layer that is momentarily configured, is mainly determined by the mutual distance between a pair of scattering bars. In addition, also the width of the scattering bars, the transmission of these bars and the phase shift introduced by these bars have their influence on the width of the image of the device feature formed in the resist.

Figure 8:
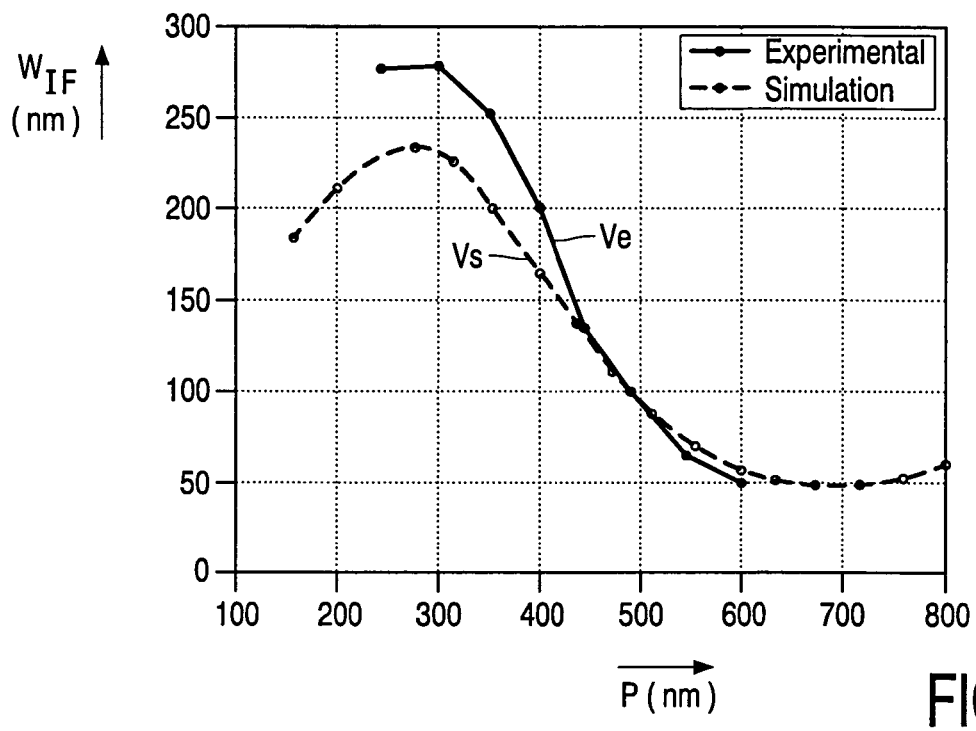
FIG. 8 shows the width of a printed device feature as a function of the mutual distance of the assist features.

FIG. 8 shows the variation of the width of a printed device feature, also called line width, $W_{IF}$ as a function of the mutual distance p of the scattering bars. For this example, the width $w_b$ of the bars is 90 nm on the substrate level, and 360 nm on the mask level if the projection system has a magnification M=¼. The broken-line graph Vs gives the line widths obtained in a computer simulation and the solid-line graph Ve gives the line widths obtained from experiments. These experiments were performed with a stepping lithographic apparatus with a coherence value σ=0.35 and a numerical aperture NA=0.63. The experimental depth of focus was approximately 0.5 μm, also for the features with the smallest width. The latitude for the exposure dose was approximately 10%.

The graph Ve in FIG. 8 shows that the printed device feature width $w_{IF}$ decreases if the mutual distance p increases. It shows also that the printed feature width can be set accurately to any value between 270 nm and 50 nm, by simply varying the distance p between the scattering bars between 250 nm and 600 nm (at substrate level). The pair of bars thus allows a choice of a printed device feature width from a broad range, the largest width of this range being more than five times larger than the smallest width.

Figure 9:
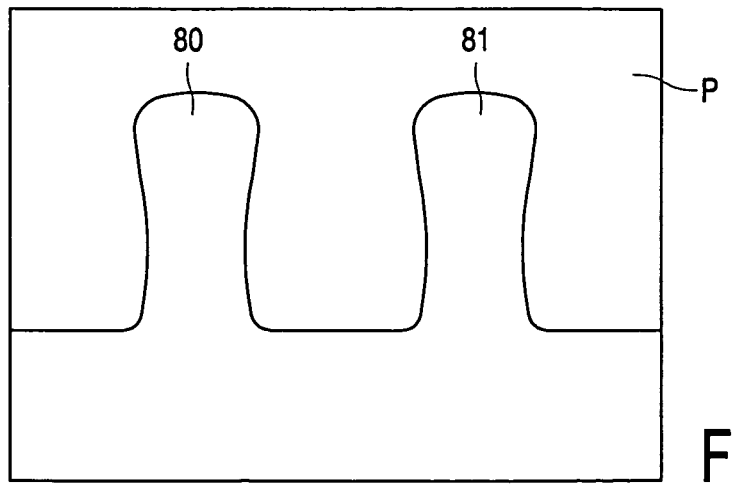
FIG. 9 shows two device features and their mutual distance obtained by the new method and the mask of FIG. 7.

By way of example, FIG. 9 shows a cross-section of two device features 80 and 81 etched in the first processing layer of polysilicon, in which the new double exposure and a phase mask with scattering bars have been used. The Figure demonstrates that device features having a width of approximately 60 nm and a mutual distance p of approximately 60 nm can be manufactured. For printing these device features, the stack of layers of FIG. 4 and the processing steps cited with respect to this stack were used. The projection apparatus used operates at a wavelength of 248 nm and has a numerical aperture NA=0.63 and a coherence value σ=0.35.

As already mentioned, the width of the printed device features is mainly determined by the distance p between the scattering bars. However, also the width $w_b$ of these bars, their transmission and the phase shift introduced by these bars in the projection beam have their influence on the final width. The parameters $W_b$, transmission and phase can be used for fine tuning of the width of the printed device features.

In principle, an assist feature may also be constituted by a phase transition instead of by an opaque bar or strip. The width of such a phase transition assist feature should be very small in order to prevent that such a feature would be imaged as such in the resist layer. This makes it more difficult to manufacture a mask pattern with assist features in the form of phase transitions.

Assist features, which, in the case of a transmission mask, have a lower transmission than their surroundings, form a better alternative to opaque, assist features. The lower transmission assist features may be called attenuated assist features and are comparable with the device features of the so-called attenuated phase mask. As described in PCT patent application WO 99/47981, an attenuated phase mask is a specific embodiment of a phase mask wherein the mask pattern features are constituted by strips having a transmission which is, for example, of the order of 5% smaller than the transmission of their surroundings. Such mask pattern features have both a phase effect and an amplitude effect on the projection beam.

The method of the invention and the specific structure of the stack of layers according to FIGS. 3 and 4 allows the use a of third, a fourth etc. sub-mask and imaging these masks in a third, a fourth, etc. resist layer. A third, fourth, etc. processing layer as well as a third, fourth, etc. anti-reflection layer (FIG. 3), or an anti-reflection layer plus a top oxide layer, should then be added to the stack of layers of FIG. 3 or 4. As all etching masks for etching the processing layers have a small topography, with a maximum height which is equal to the sum of the thickness of a processing layer and an anti-reflection layer, etching can be performed in a very accurate way. The required number of sub-masks used and thus the number of successive exposures of the stack of layers depends on the complexity and density of the total mask pattern. The complexity and density of a total mask pattern is not only determined by those of the device pattern to be configured in a substrate layer, but also by other features which may be added to the mask pattern for different purposes.

The simplest mask structure for a mask pattern is a transmission, for example a chromium, mask. Each pattern feature of a transmission mask, also called binary mask, will be imaged and corresponds to a feature of the device feature to be configured in the relevant substrate layer. An alternative for a transmission sub-mask is a reflective sub-mask comprising a pattern of reflective and non-reflective areas. A reflective mask also belongs to the binary mask category.

A more complex mask structure for a mask pattern is a transmission, or reflective, mask provided with phase-shifting elements. Adding phase shifting elements means that the density of the mask pattern is increased.

Figure 10:
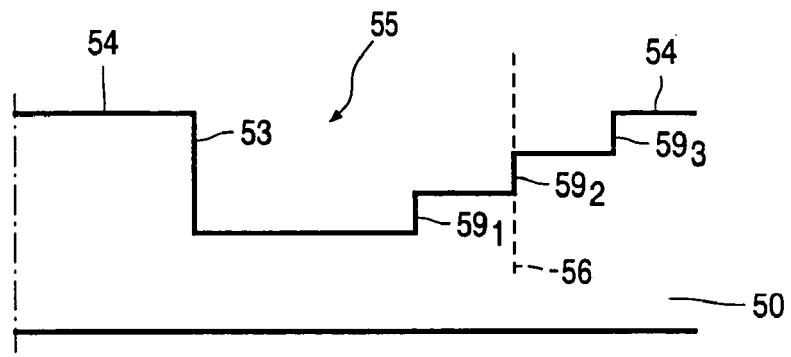
FIG. 10 shows a phase mask feature with a stepped phase transition.

Another mask structure for a mask pattern is a phase mask, which may be a transmission mask or a reflective mask. A transmission phase mask has been discussed herein before with reference to FIG. 6. This Figure shows only one vertical transition, from the mask surface 54 to the recessed area 55, which transition is used to realize a strip-shaped illumination 68 of the resist layer. However, the mask area used for creating this strip, and thus a corresponding device feature in the substrate layer comprises a second transition, from the recessed area 55 to the mask surface 54, as shown in FIG. 10. In this Figure, the first transition is indicated by the solid vertical line 53 and the second transition is indicated by the broken vertical line 56. In order to prevent the second transition from being also imaged in the resist layer, the transition 56 causing a phase shift of 180° may be sub-divided into a number of sub-transitions each causing a smaller phase shift. For example, three sub-transitions $59_1$, $59_2$ and $59_3$ each causing a phase shift of 60° may be present at the trailing edge of the recess area 55. Projection beam portions from the sub-transitions have different phases and radiation from the area of the sub-transitions will be smeared out and not concentrated in a small area, like area 68 in FIG. 6. Additional space in the mask pattern is needed for the sub-transitions. Some space is also required for the assist features, or bars, 70 and 71 in the phase mask of FIG. 7, which assist features are used to control the width of device features.

Figure 11:
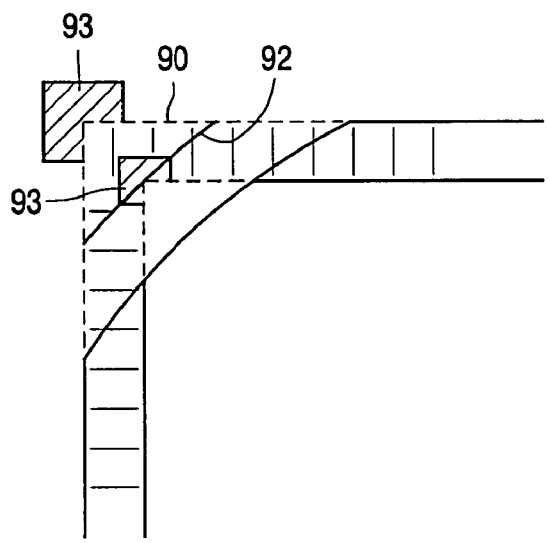
FIG. 11 shows a mask feature bend with serif OPC elements.
Figure 12:
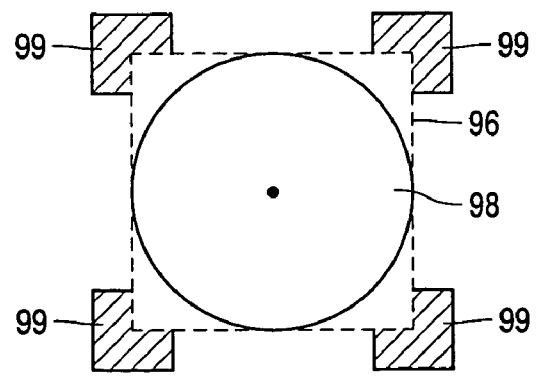
FIG. 12 shows a square mask feature with serif OPC elements.
Figure 13:
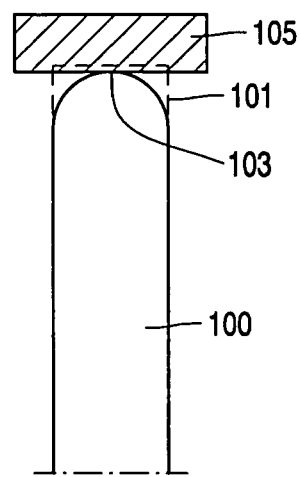
FIG. 13 shows a strip-shaped mask feature with a hammerhead OPC element.
Figure 14:
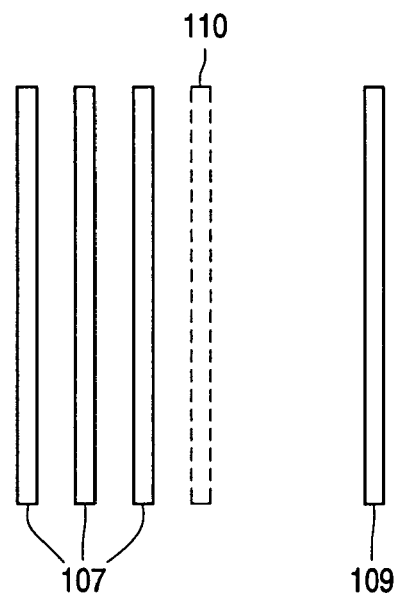
FIG. 14 shows a portion of a mask pattern with a scattering bar.
Figure 15:
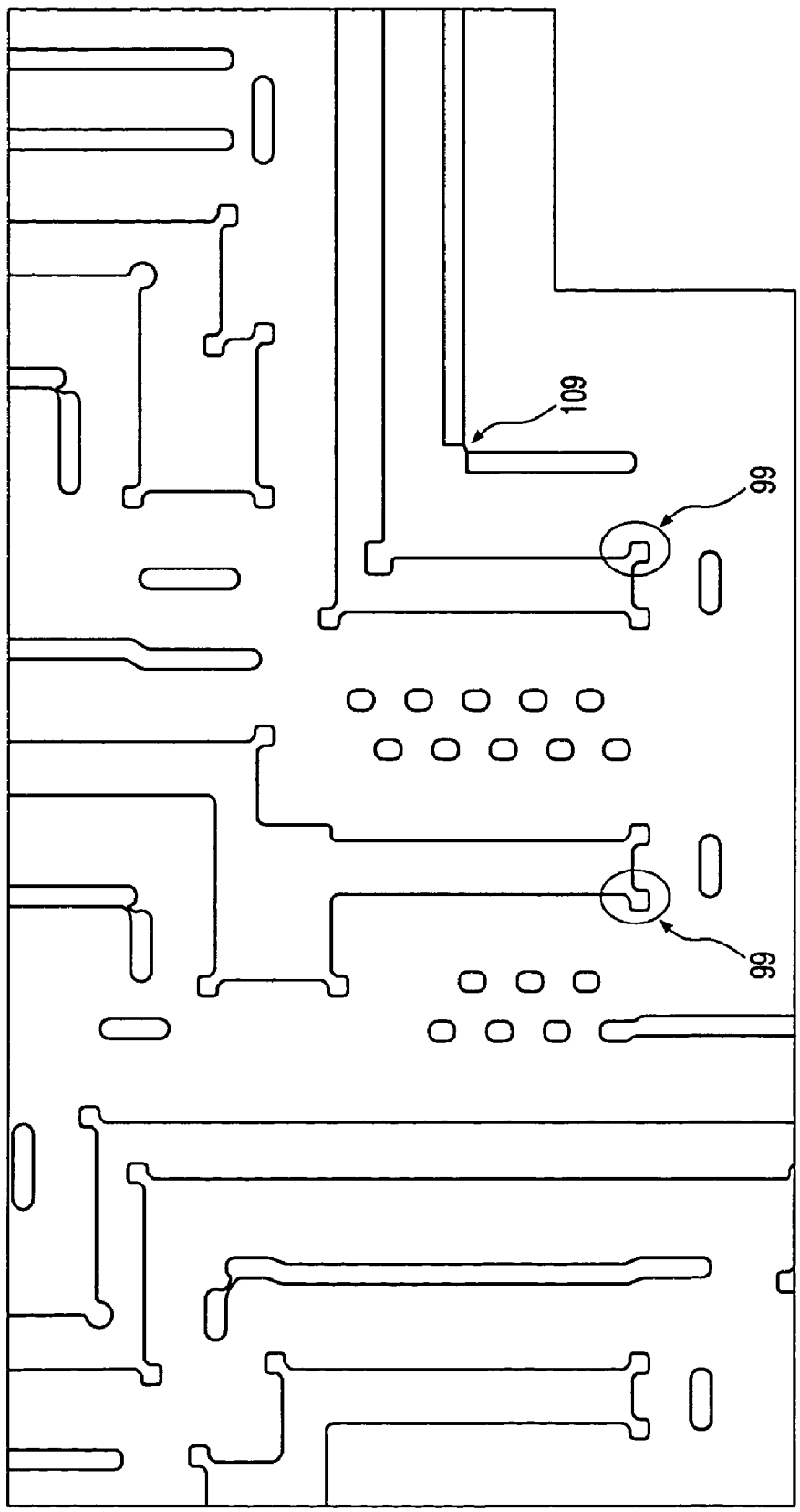
FIG. 15 shows a small portion of a practical mask pattern with serifs and scattering bars.

As the projection system of an optical lithographic projection apparatus is employed at its resolution border, imaging of mask pattern features is no longer perfect and is accompanied by aberrations, especially at the edges of these features. For example, and as shown in FIG. 11, a 90° bend 90 of a feature may be imaged as a curved bend 92 and a square feature area 96 may be imaged as a circular area 98, as shown in FIG. 12. To correct for these aberrations, small, so-called optical proximity correction (OPC) elements 93 and 99, respectively, may be added to the original mask pattern. The OPC elements 93 and 99 are called serifs. As shown in FIG. 13, a straight edge 101 of a strip-shaped mask pattern feature may be imaged as a curved edge 103. An OPC element 105, called a hammerhead, may be added to the original mask pattern in order to obtain an image with a straight edge. As shown in FIG. 14, some pattern features may be arranged close to each other, while the next feature 109 is located at a larger distance. When imaging such a pattern portion, it may happen that an artefact is formed in the resist layer between the image of the last of feature 107 and the feature 109. To prevent formation of such an artefact, a small scattering bar 110 may be added to the original mask pattern. The scattering bar is not imaged, but diffracts projection radiation and, due to interference with the radiation, which would form the artefact, causes the artefact not to be formed. As shown by way of example in FIG. 15, a mask pattern may comprise both OPC elements and scattering bars. This Figure shows a small portion of a mask pattern that is used in practice. The portion shown comprises a large number of serifs 99 and two mutually perpendicular scattering bars 109.

Figure 16:
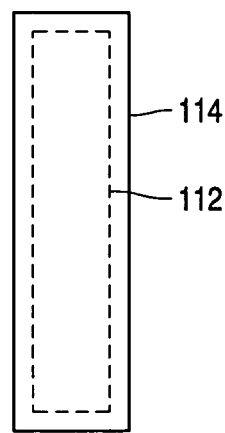
FIG. 16 shows the sizing of a mask pattern feature.

Due to imperfections of the imaging step and/or other several process steps, it may happen that the transfer of a mask pattern feature in a processing layer is accompanied by a certain shrinkage, i.e. the width or length of the printed device feature is smaller or shorter than corresponds to the mask feature. To correct for such shrinkage, the width or length of the original design feature may be increased, which is known as sizing of mask features. This is illustrated in FIG. 16, wherein the original design feature 112 is indicated by broken lines and the sized feature 114 is indicated by solid lines.

Although the additional space in the mask pattern required for OPC elements and sizing is relatively small per se, application of the OPC and sizing technique may bring a corrected pattern feature too close to one or more neighbouring features. This would mean that the OPC and sizing techniques would not be applicable.

The above-mentioned phase-shifting elements, assist features, OPC elements, scattering bars can be generally referred to as features associated with a device feature or associated features.

The problem of a too high density, or too small distance between mask pattern features, which may occur both in a binary mask, a phase mask, a phase mask with assist features, or in each of these masks provided with OPC elements, scattering bars or sized features can be solved by distributing device features with their associated features on a number of sub-patterns and by superposed transfer of the sub-patterns to the relevant substrate layer by means of the special stack of layer discussed hereinbefore.

The distribution method in combination with the special lithographic stack of layers can also be used for solving the problem that mask pattern portions showing certain symmetries, called forbidden symmetries, cannot be imaged with the required quality due to projection system aberrations which become manifest for such symmetries. For example, if a mask pattern portion shows symmetry along three axes, the image of this portion may be disturbed due to the three-point aberration of the projection system. This kind of aberration is discussed in the article: "Zernike Coefficients: Are they really enough?" by C. Progler et al in: Proceedings of the SPIE Vol. 4000, 2000, pp.40–46.

Moreover, if a specific kind of illumination of the mask pattern is employed in the projection apparatus, for example a so-called off-axis illumination like a dipole or quadrupole illumination, mask pattern portions showing specific periodicities, called forbidden symmetries, cannot be imaged with the required quality. For example, if an off-axis beam, for example a beam with an annular cross-section illuminates the mask pattern, for imaging the mask pattern, only sub-beams diffracted in first diffraction orders are used. This means that only first order sub-beams should fall completely within the pupil of the projection system, while second and further higher order sub-beams should not fall within this pupil. As the angles at which first a higher order sub-beams are diffracted by a mask pattern portion are determined by the period within this portion, i.e. the smaller the period, the larger the diffraction angle, the requirement can be met only for a given range of periods. For pattern periods smaller than those of said given range, the first-order beams will shift out of the pupil and the image formed will be incomplete. For pattern periods larger than those of said given range, second and other higher-order beams will shift into the pupil and cause a disturbance of the image formed. Thus, periods outside said given range are forbidden. In the case of quadrupole illumination, i.e. only portions of the four quadrants of the pupil are illuminated, while other periods and symmetries in the mask pattern are forbidden. The disturbing effect of forbidden periods and symmetries which occur in the original design mask pattern can be substantially reduced, or even eliminated, by distributing the features of this pattern on a number of sub-mask patterns. As these sub-patterns are separately imaged, the illumination conditions for these sub-patterns can be adapted to their pattern structure so that they can be imaged in an optimum way.

In practice, the optimum illumination conditions for pattern features extending in the x-direction of the two-dimensional, X-Y, pattern may be different from those conditions for pattern features extending in the Y-direction. According to the present invention, the X features and the Y-features can be arranged in a first sub-mask pattern and in a second sub-mask pattern, respectively, and both patterns can be imaged superposed, using the specific stack of layers. Optimum illumination conditions can be chosen, both for the X-features and for the Y-features.

The invention also provides an efficient method of distributing the original mask pattern features on sub-mask patterns. Efficient is understood to mean that none of the sub-mask patterns comprises any aberration-sensitive pattern portion, while the number of sub-masks is as small as possible. The term aberration-sensitive pattern portion is understood to mean a pattern portion, which, when imaged under the prescribed illumination conditions, would result in an image suffering from aberrations. The aberration-sensitivity may be caused by:

a minimum distance between pattern features, assist features, OPC elements and scattering bars mutually and with respect to each other, which is too small in view of the resolution of the projection system;

a symmetry in the feature pattern for which the projection system has an inherent incapability to image without aberration;

a spatial period in the feature pattern which is incompatible or less compatible with the kind of illumination prescribed, and an orientation, in the mask plane, of features which is less compatible with the kind of illumination prescribed.

Figure 17:
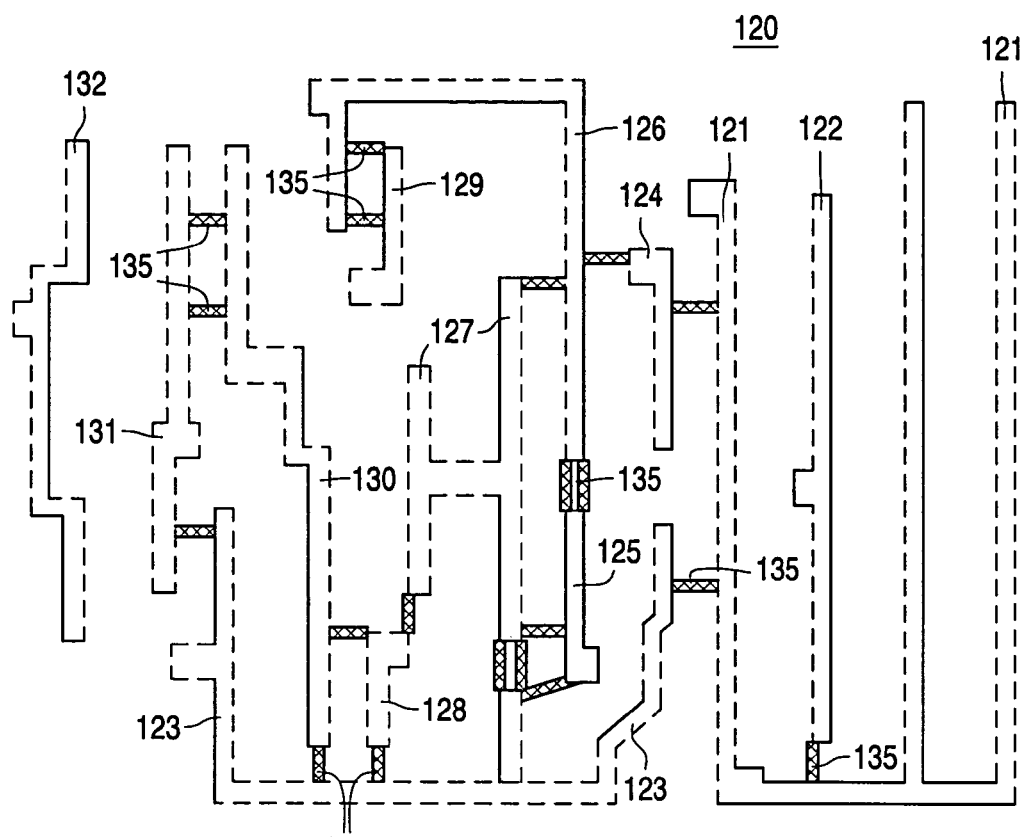
FIG. 17 shows an original design pattern of a flip-flop circuit.
Figure 18A:
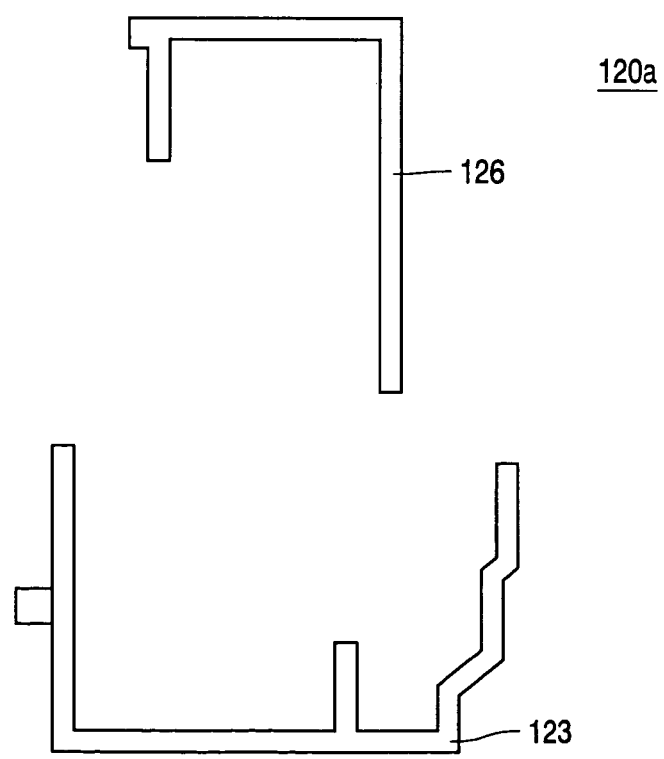
FIGS. 18a–18d show the distribution of the features of this pattern on three sub-patterns.
Figure 18B:
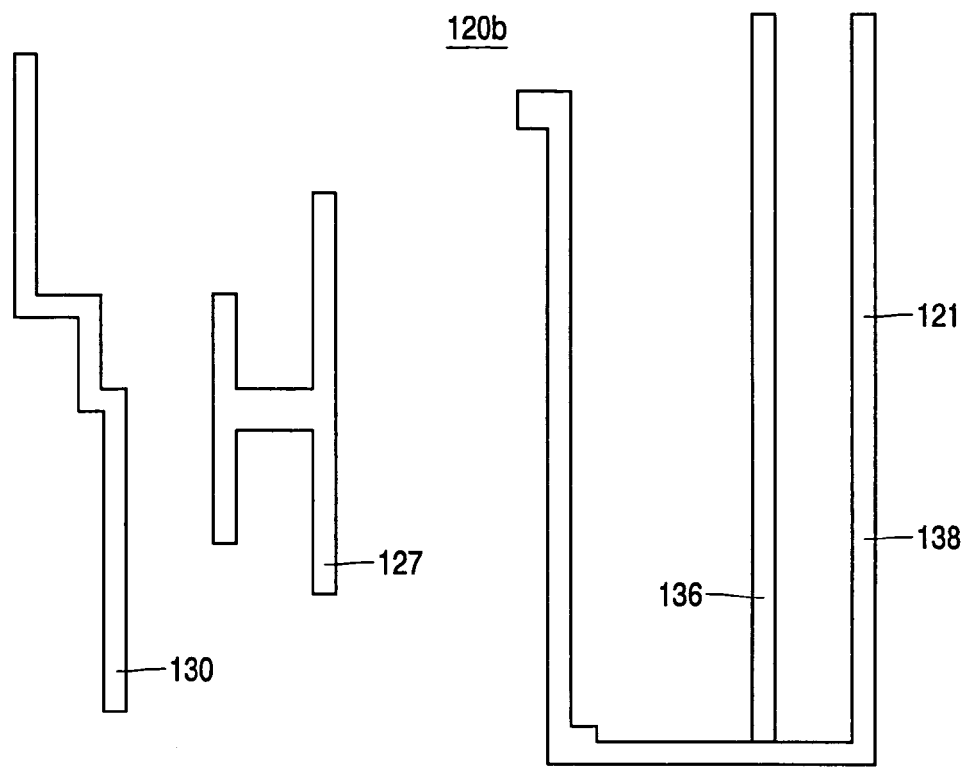
Figure 18C:
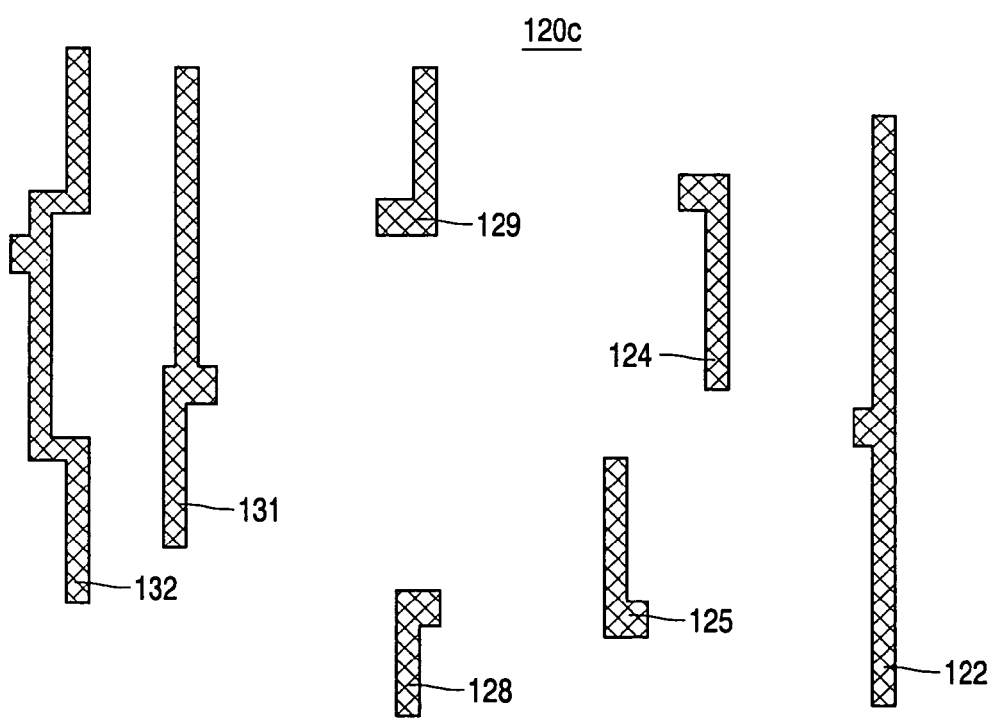
Figure 18D:
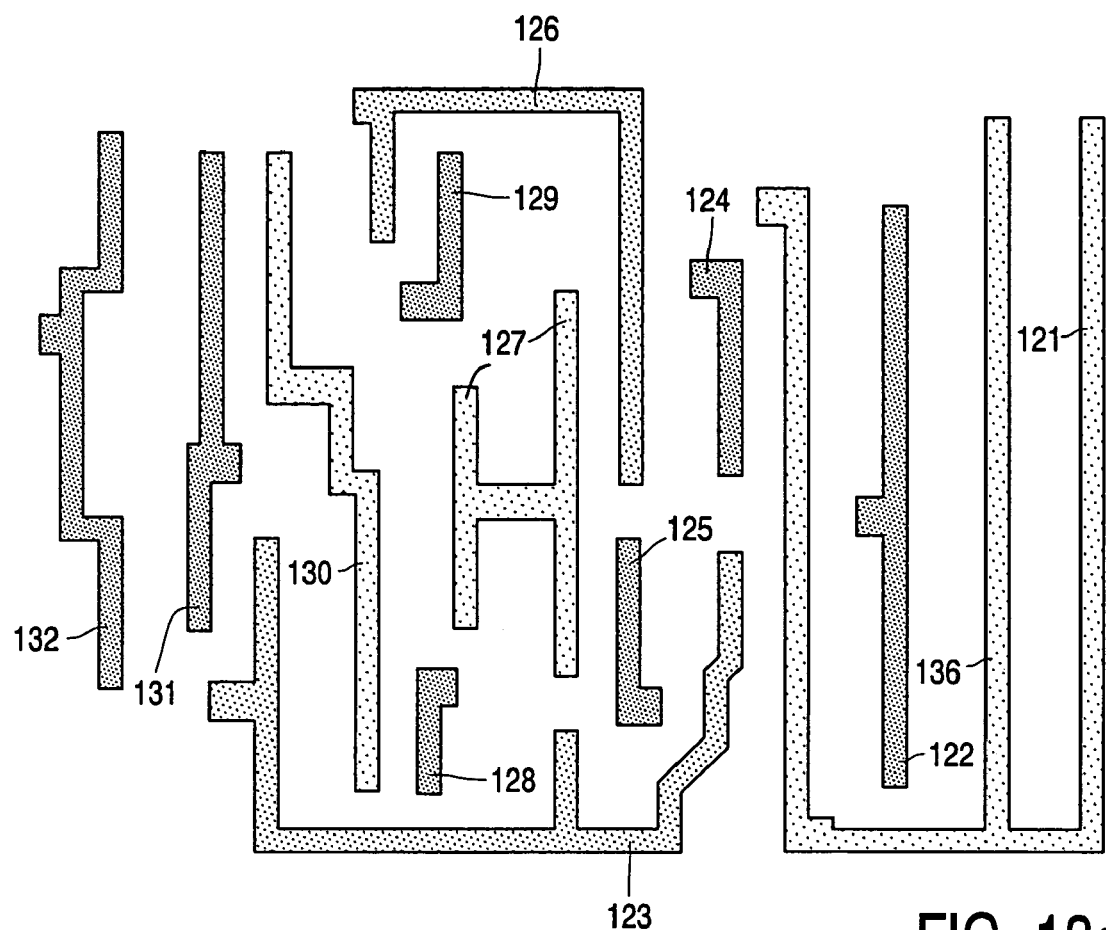

An embodiment of the distributing method will be described with reference to a flip-flop circuit. The starting point is a layout, or design, of the circuit in the form of a standardized file, for example a GDS$_2$-file. This file consists of a long list of mask features, also called polygons, which together constitute the circuit. FIG. 17 shows a portion of the original design mask pattern of the flip-flop circuit. The pattern comprises twelve polygons 121 to 132. A general rule for this pattern is that the distance between neighbouring parts of the polygons should be larger than a given minimum distance, which is determined by, inter alia, the resolution of the projection system. The positions in the mask pattern, where this rule is violated, are denoted by the hatched small strokes 135. In total, there are 18 of such positions. As a first step, the polygon with the largest number of violation is selected and this polygon, polygon 123 showing six violations, is moved to a first sub-mask pattern 120a, shown in FIG. 18a. In the next step, the polygon with the largest number of violations is selected from the remaining polygons. This is polygon 126 showing four violations. As polygon 126 is positioned at a sufficient distance from polygon 123, it can also be moved to the first sub-mask pattern 120a without introducing violations in this sub-mask pattern. The rest of the original mask pattern comprises three polygons, 121, 127 and 130 each showing three violations. These polygons cannot be moved to the first sub-mask pattern because their distance to the polygons 123 and 126 is too small. The polygons 121, 127 and 130 should therefore be moved to another sub-mask and, as no violations occur between them, they can be moved to a single sub-mask. The sub-mask pattern 120b comprising the polygons 121, 127 and 130 is shown in FIG. 18b. The rest of the original mask pattern, comprising polygons 122, 124, 125, 128, 129, 131 and 132, does not show any violation so that these polygons can remain in a single sub-mask pattern, which is the third sub-mask pattern shown in FIG. 18c. FIG. 18d has been added to show in one view the three sub-mask patterns, which are distinguished from each other by different grading.

Figure 19:
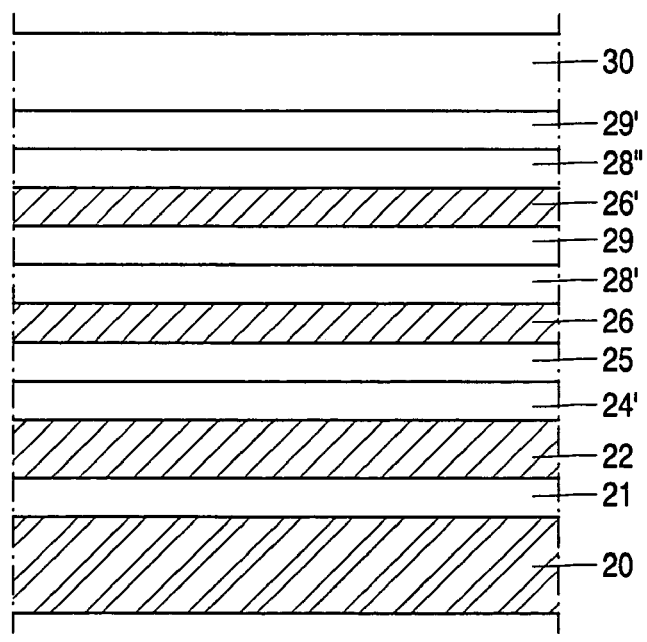
FIG. 19 shows the stack of layers used for transferring the mask pattern feature of FIG. 17 in a substrate layer.

To image the three sub-mask pattern in a superposed manner, a stack of layers comprising three processing layers, as shown in FIG. 19, has to be used. The stack of FIG. 19 is similar to that of FIG. 4, but extended with a third processing layer 26', a third anti-reflection layer 28" and a third oxide layer 29'. These layers preferably have the same thickness and comprise the same materials as layers 26, 28' and 29.

The same method described hereinbefore, for of transfer a mask pattern, to a substrate layer wherein polygons or device features are too close to each other, can also be used for transferring a mask pattern wherein the device features are at a sufficient distance, but to which OPC elements, scattering bars or assist features have to be added for an accurate and reliable imaging of the device features. The method can also be used for transferring a mask pattern wherein device features are too close to each other and which comprises also OPC elements, scattering bars and assist features. The distribution on the sub-mask pattern should be such that said OPC elements, scattering bars and assist features are moved to the sub-mask pattern of the device feature to which they belong. As already remarked, the method can also be used for removing forbidden symmetries and periods from the mask pattern and for preventing pattern features extending in a first, X-, direction and a second, Y-, direction from being imaged under the same illumination conditions. If only the X-pattern features and the Y- pattern feature of a pattern should be moved to a first and a second sub-mask pattern, respectively, a stack of layers with only two processing layers is needed.

If a number of different illumination conditions are needed for imaging different sub-mask patterns, a corresponding number of projection apparatus can be used, each adapted to the specific sub-mask pattern to be imaged by it. In general, different projection apparatus can be used, irrespective of the kind of illumination, for imaging the sub-mask patterns needed for configuring a substrate layer.

Up to now it has been assumed that each sub-pattern of features is transferred to the relevant substrate layer by optically imaging a sub-mask comprising this pattern in the resist layer. However, it is also possible to transfer at least one sub-pattern to the resist layer by means of a projection apparatus other than an optical projection apparatus, for example a charged-particle beam apparatus like an E-beam projection apparatus. Instead of using a mask and imaging this mask, a sub-pattern can also be transferred to a resist layer by writing this pattern in the layer. The writing apparatus may be a charged-particle beam apparatus, like an electron beam-writing apparatus. The data for the at least one sub-pattern is supplied to the E-beam apparatus which then writes the sub-pattern directly in a resist layer on the stack of layers. The resist layer may be of the same material as that of the layer wherein a mask pattern is imaged optically. The use of an E-beam apparatus is attractive when an original mask pattern comprises a relatively small number of small features and/or the number of devices to be manufactured is small.

Figure 20:
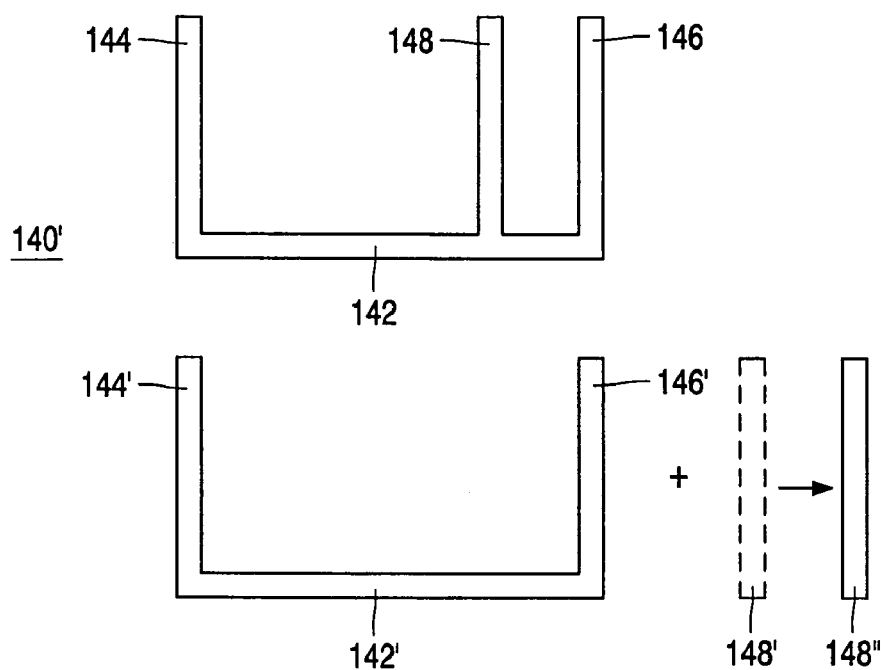
FIG. 20 shows a pattern feature with portions at a too short distance and two sub-mask patterns with overlapping features used for creating the pattern feature.

In the example of FIGS. 18 to 18d, the features of one of the sub-mask patterns 120a to 120c do not have any overlapping portion with features of one of the other sub-mask patterns. However, strips belonging to one feature, for example the two left strips 136 and 138 of feature 121 (FIG. 18b) may be too close to each other. A distribution on sub-feature level can then be carried out, i.e. portions belonging to one feature are distributed on different sub-mask patterns, as shown by way of example in FIG. 20. A design feature 140 comprises a horizontal strip 142 and three vertical strips 144,146 and 148, where 146 and 148 are too close to each other. A first sub-mask pattern is formed which comprises a feature 140' having strips 142', 144' and 146' corresponding to the strips 142, 144 and 146, respectively. A strip 148' with a length corresponding to that of strip 148 in the design pattern should be arranged in a second sub-mask pattern. An essential condition is, that there is no opening between the strips 148 and 142 in the printed feature in the substrate layer, i.e. strip 148 should merge with strip 142. In order to avoid that stroke 148 does not merge with strip 142 in the printed feature, the strip 148' is lengthened so that this strip 148'" in the second sub-mask pattern shows some overlap with strip 142' in the first sub-mask pattern. Such an overlap does not cause any problem in the method of the invention.

Instead of using only positive resist layers, as in the embodiments of FIGS. 3a to 3h, also a combination of positive resist layers and a negative resist layer may be used. In general, a negative resist layer will be used in combination with a dark field mask if a small feature in a blank (empty) area has to be imaged and when a mirror inversion of a pattern is required.

Figure 21:
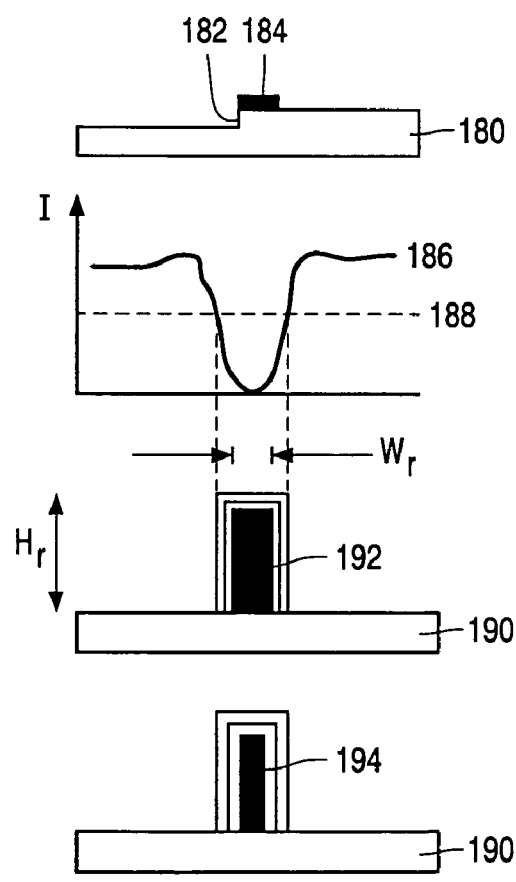
FIG. 21 shows the technique of resist ashing.

The distance between the features printed in the relevant substrate layer can be considerably reduced by the combination of the feature distribution method and the stack of layers. In cases where a reduction of the width of features is required, the known technique of resist ashing can be added as a further processing step. FIG. 21 shows the principle of his technique with reference to an embodiment wherein a phase-shifting mask 180 is used, which has chromium strips 184 at the transitions 182. After exposure of a resist layer with such a mask, the intensity of the radiation received by the resist at the location of the transition is indicated by the curve 186. The horizontal line 188 through the curve 186 denotes the threshold for development. After development, a resist pattern on substrate 190 is obtained. A resist feature 192 has a given width Wr and height Hr. The resist pattern is then etched with an O2 plasma etch. At both flanks and at the top of the resist feature, resist material is converted to an ash-like substance and removed. The result of this resist ashing is a considerably reduced resist feature 194. In this way, the width of the resist feature can be reduced by several tens of percent. Resist ashing is described in the article: "Extension of Kr—F lithography to sub-50 nm pattern formation" by S. Nakao et al. in SPIE, Vol. 4000, 2000, p.358.

The invention claimed is:

1. A method of manufacturing a device in at least one layer of a substrate, the method comprising the steps of:
   providing a design pattern comprising pattern features corresponding to device features to be configured in said layer;
   transferring the design pattern in a resist layer provided on said substrate layer;
   removing material from or adding material to areas of said layer, which areas are delineated by the patterned resist layer;
   a number of sub-patterns each comprising different portions of the design pattern being successively transferred in a corresponding number of resist layers, which are consecutively coated on said substrate layer, characterized by the steps of:
   forming a stack of at least a first pair of a processing layer and an anti-reflection layer and a second pair of such layers on the substrate;
   coating a resist layer on the top processing layer and transferring a first sub-pattern in the resist layer;
   developing the resist layer, thereby forming a first intermediate pattern corresponding to the first sub-pattern;
   etching the top processing layer via the first intermediate pattern, thereby forming a first pattern of device features corresponding to the first sub-pattern;
   coating the first pattern of device features wit a second resist layer;
   transferring a second sub- pattern in the second resist layer;
   developing the second resist layer, thereby forming a second intermediate pattern corresponding to the second sub-pattern;
   etching an underlying processing layer via the etching mask constituted by the interleaved first pattern of device features and second intermediate pattern, thereby forming a second pattern of device features corresponding to the combination of the first and second sub-patterns, and
   removing the second resist layer and the top processing layer.

2. A method as claimed in claim 1, characterized in that at least a third pair of a processing layer and an anti-reflection layer is added to the substrate side of the stack of layers, and in that the following additional steps are carried out:
   coating the second pattern of device features with a third resist layer;
   transferring a third sub-pattern in the third resist layer, developing the third resist layer, thereby forming a third intermediate pattern corresponding to the third sub-pattern;
   etching the third processing layer via the second pattern of device features and the third intermediate pattern, thereby forming a third pattern of device features corresponding to the combination of the first, the second and the third sub-patterns; and
   removing the third resist layer and the second processing layer.

3. A method as claimed in claim 1, characterized in that each sub-pattern is transferred in the corresponding resist layer by optically imaging a sub-mask, comprising the sub-pattern, in the resist layer.

4. A method as claimed in claim 1, characterized in that at least one of the sub-patterns is transferred to the corresponding resist layer by writing this sub-pattern in the resist layer by means of a charged particle beam.

5. A method as claimed in claim 3, characterized in that all sub-mask patterns are imaged with radiation of the same wavelength range.

6. A method as claimed in claim 3, characterized in that at least one of the sub-mask patterns is imaged by means of EUV radiation and the other sub-mask patterns are imaged by means of DUV radiation.

7. A method as claimed in claim 3, characterized in that least one of the sub-mask patterns is imaged by means of a charged-particle projection beam.

8. A method as claimed in claim 1, characterized in that, in all pairs of layers, corresponding layers comprise the same material and have the same thickness, with the exception of the processing layer at the side of the substrate which has a larger thickness than the other processing layer(s).

9. A method as claimed in claim 1, characterized in that the material of each layer of a pair is resistant against the etching process used for etching the other layer of the pair.

10. A method as claimed in claim 1, characterized in that the processing layers used are polysilicon layers.

11. A method as claimed in claim 1, characterized in that the anti-reflection layers used are dual layers comprising an anti-reflection film and an oxide film on top of it.

12. A method as claimed in claim 1, characterized in that the material of a single anti-reflection layer or the material of the end-reflection film of a dual layer is an inorganic material.

13. A method as claimed in claim 12, characterized in that the inorganic material is silicon-oxide-nitride $Si_zO_xN_y$.

14. A method as claimed in claim 13, characterized in that the inorganic material is silicon-nitride SiN.

15. A method as claimed in claim 1, characterized in that positive resist layers are used.

16. A method as claimed in claim 1, characterized in that positive and negative resist layers are used.

17. A method as claimed in claim 1, characterized in that features of at least one of the intermediate patterns are reduced in size by resist ashing before etching such a pattern in the underlying processing layer.

* * * * *